(12) United States Patent
Tanaka et al.

(10) Patent No.: US 7,372,113 B2
(45) Date of Patent: May 13, 2008

(54) SEMICONDUCTOR DEVICE AND METHOD OF MANUFACTURING THE SAME

(75) Inventors: Masayuki Tanaka, Yokohama (JP); Yoshio Ozawa, Yokohama (JP); Shigehiko Saida, Yokohama (JP); Akira Goda, Yokohama (JP); Mitsuhiro Noguchi, Yokohama (JP); Yuichiro Mitani, Zushi (JP); Yoshitaka Tsunashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

(21) Appl. No.: 10/880,508

(22) Filed: Jul. 1, 2004

(65) Prior Publication Data

US 2004/0251521 A1     Dec. 16, 2004

Related U.S. Application Data

(62) Division of application No. 10/278,882, filed on Oct. 24, 2002, now Pat. No. 6,774,462.

(30) Foreign Application Priority Data

May 29, 2002    (JP)    ............................. 2002-155740

(51) Int. Cl.
*H01L 21/314* (2006.01)
(52) U.S. Cl. ............... 257/411; 257/640; 257/E21.212; 438/791
(58) Field of Classification Search ........ 438/791–792; 257/637–640, 411, E21.212
See application file for complete search history.

(56) References Cited

U.S. PATENT DOCUMENTS

| | | | | |
|---|---|---|---|---|
| 5,041,888 A | * | 8/1991 | Possin et al. | .................. 257/59 |
| 5,306,946 A | * | 4/1994 | Yamamoto | .................. 257/640 |
| 6,023,093 A | * | 2/2000 | Gregor et al. | .............. 257/632 |
| 6,103,556 A | | 8/2000 | Nishimura et al. | ......... 438/149 |
| 6,137,156 A | | 10/2000 | Ichikawa et al. | |
| 6,215,148 B1 | | 4/2001 | Eitan | |

(Continued)

FOREIGN PATENT DOCUMENTS

JP      60-60770      4/1985

(Continued)

OTHER PUBLICATIONS

Bu et al.; "Effects of Two-Step High Temperature Deuterium Anneals on SONOS Nonvolatile Memory Devices," IEEE Electron Device Letters, vol. 22, No. 1, pp. 17-19, (2001).
Khare et al.; "Extending Scaling Limit of Tunnel Oxide by the Use of Nitride/Oxynitride in Flash Memory Devices"; Non-Volatile Semiconductor Memory Workshop, pp. 95-97, (1998).

(Continued)

*Primary Examiner*—Howard Weiss
*Assistant Examiner*—John Ingham
(74) *Attorney, Agent, or Firm*—Finnegan, Henderson, Farbow, Garrett & Dunner, L.L.P.

(57) ABSTRACT

Disclosed is a semiconductor device comprising a semiconductor substrate, a gate electrode, a first insulating film formed between the semiconductor substrate and the gate electrode, and a second insulating film formed along a top surface or a side surface of the gate electrode and including a lower silicon nitride film containing nitrogen, silicon and hydrogen and an upper silicon nitride film formed on the lower silicon nitride film and containing nitrogen, silicon and hydrogen, and wherein a composition ratio N/Si of nitrogen (N) to silicon (Si) in the lower silicon nitride film is higher than that in the upper silicon nitride film.

20 Claims, 15 Drawing Sheets

U.S. PATENT DOCUMENTS

| | | | |
|---|---|---|---|
| 6,417,570 B1 * | 7/2002 | Ma et al. | 257/760 |
| 6,602,771 B2 * | 8/2003 | Inoue et al. | 438/585 |
| 6,642,099 B2 | 11/2003 | Arimochi et al. | 438/244 |
| 2002/0017169 A1 | 2/2002 | Hu | 81/63.1 |
| 2003/0122204 A1 | 7/2003 | Nomoto et al. | 257/406 |
| 2003/0151119 A1 | 8/2003 | Sakama et al. | 257/639 |

FOREIGN PATENT DOCUMENTS

| | | | |
|---|---|---|---|
| JP | 2-59632 | | 12/1990 |
| JP | 5-48631 | | 7/1993 |
| JP | 6-125091 | | 5/1994 |
| JP | 9-64205 | | 3/1997 |
| JP | 11-046000 | * | 2/1999 |
| JP | 3382130 | * | 2/1999 |
| JP | 11-224908 | | 8/1999 |
| JP | 2000-349283 | | 12/2000 |
| JP | 2002-203917 | | 7/2002 |
| JP | 2002-208646 | | 7/2002 |

OTHER PUBLICATIONS

Melik-Martirosian et al.; "An Experimental Flash Memory Cell With 55Å EOT Silicon Nitride Tunnel Dielectric"; Non-Volatile Semiconductor Memory Workshop, pp. 67-69, (2001).

Notification of the First Office Action issued by the Chinese Patent Office, dated Dec. 10, 2004, for Chinese Application No. 031381359, and English-language translation thereof.

1) Notification for Filing Opinion issued by the Korean Patent Office for Patent Application No. 10-2003-34051.

2) Notification for Filing Opinion issued by the Korean Patent Office for Patent Application No. 10-2005-0027960.

3) Notification for Filing Opinion issued by the Korean Patent Office for Patent Application No. 10-2005-0027963.

M. Tanaka et al., Realization of High Performance Dual Gate DRAMs without Boron Penetration by Application of Tetrachlorosilane Silicon Nitride Films, 2001 Symposium on VLSI Technology Digest of Technical Papers, pp. 123-124.

* cited by examiner

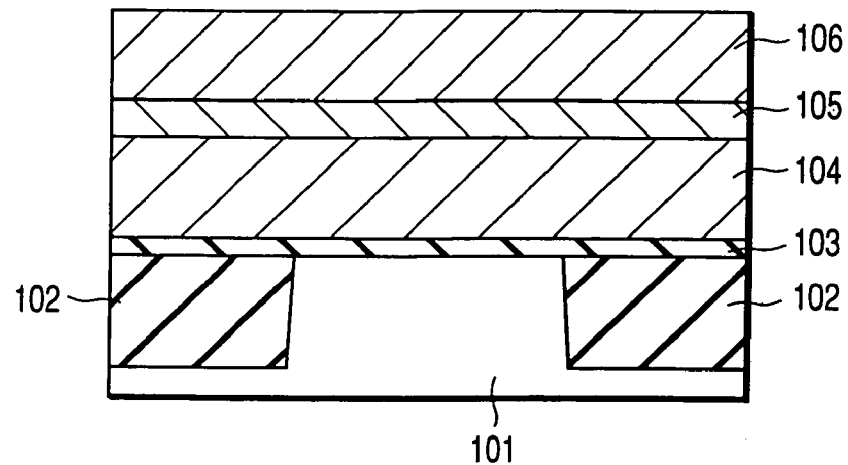
F I G. 1
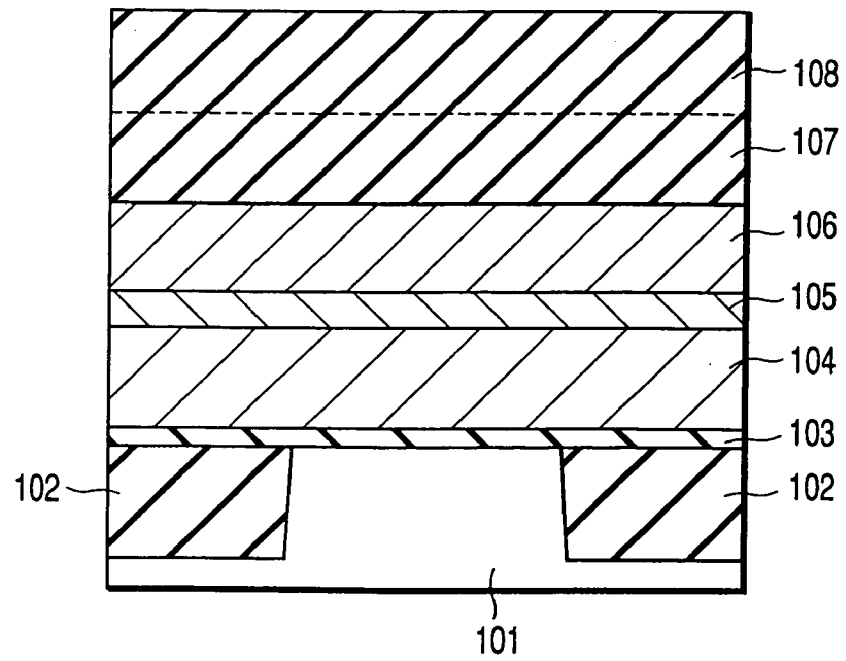
F I G. 2

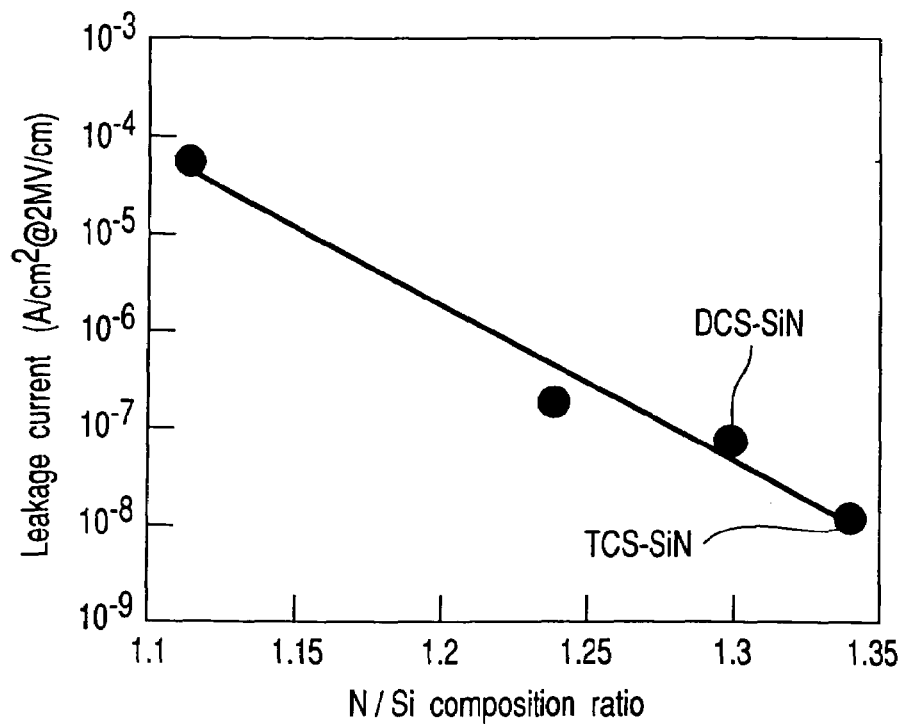
F I G. 6
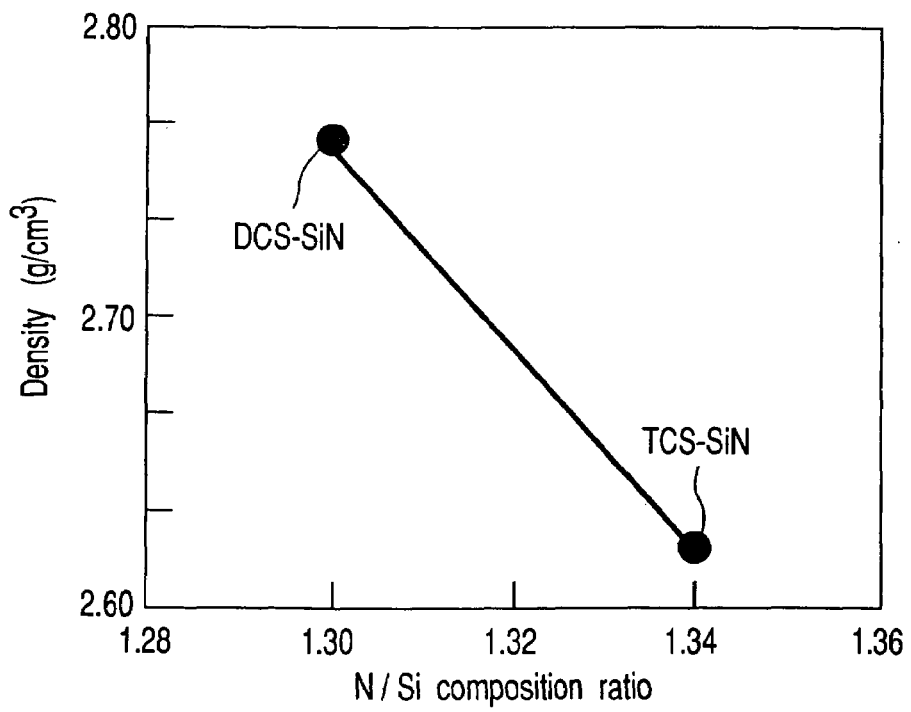
F I G. 7

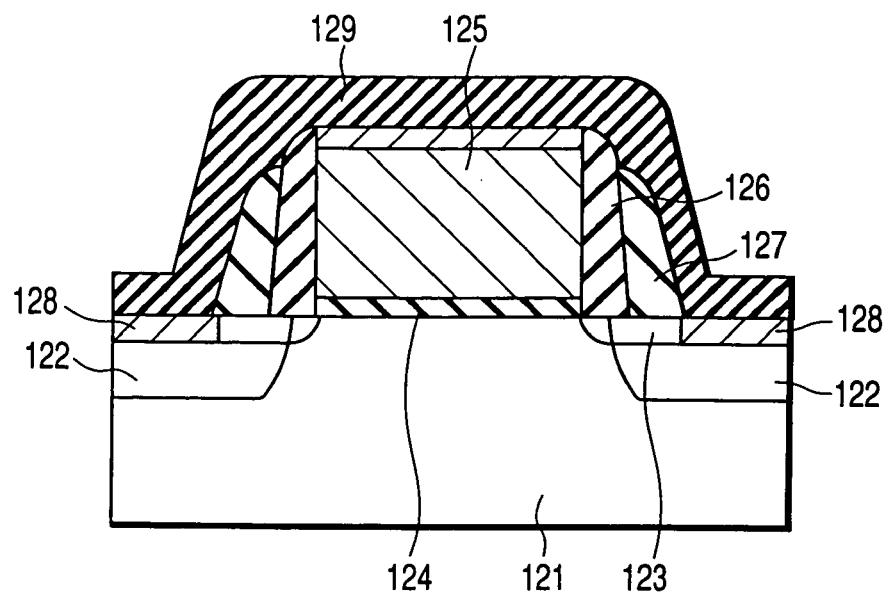
F I G. 11
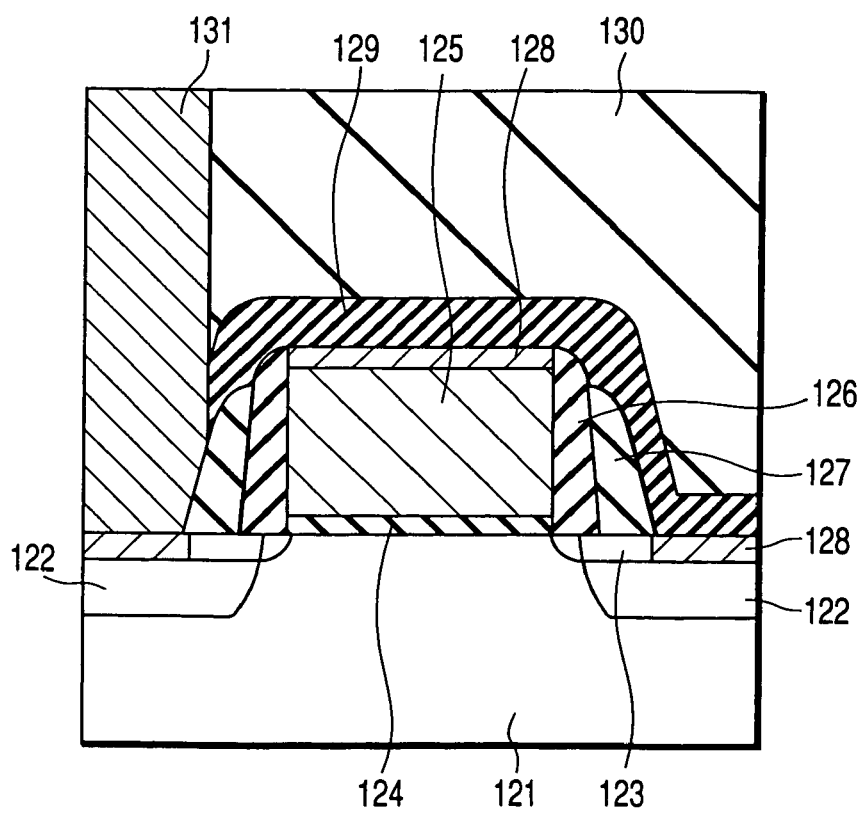
F I G. 12

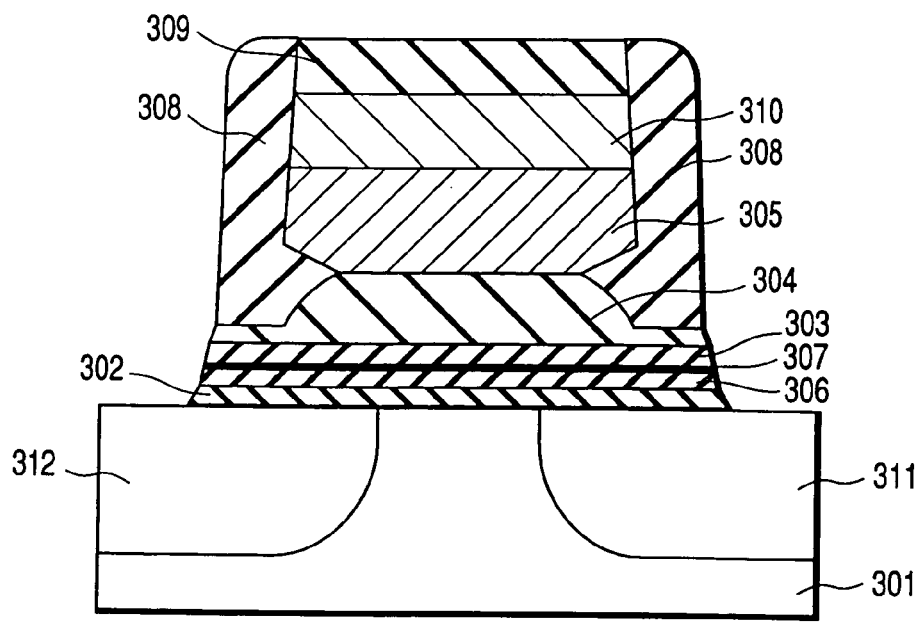
F I G. 17
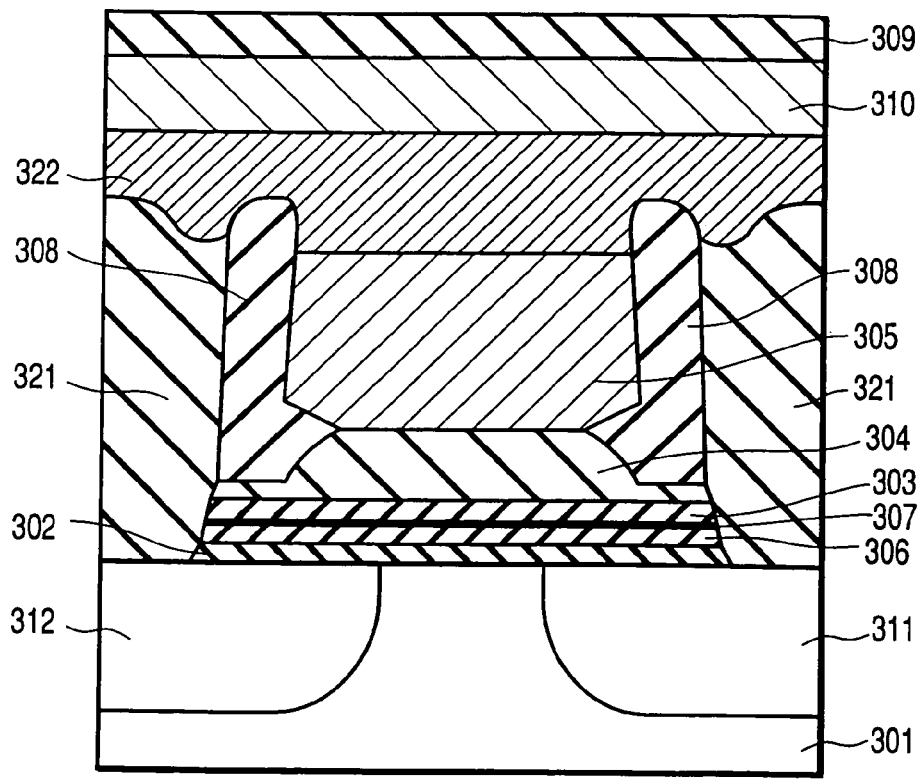
F I G. 18

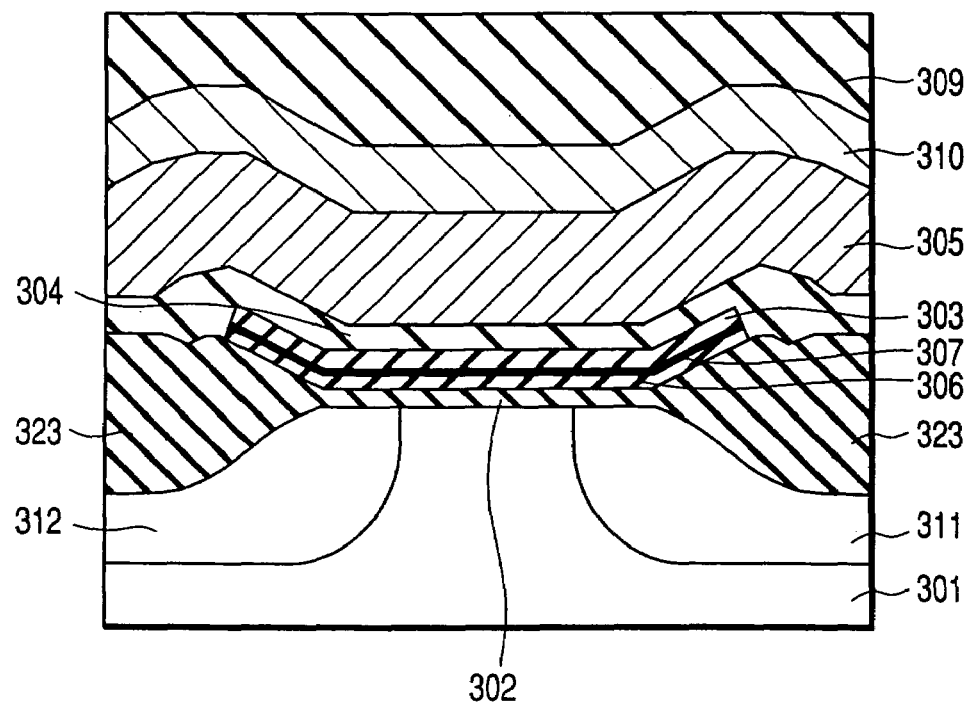
F I G. 19
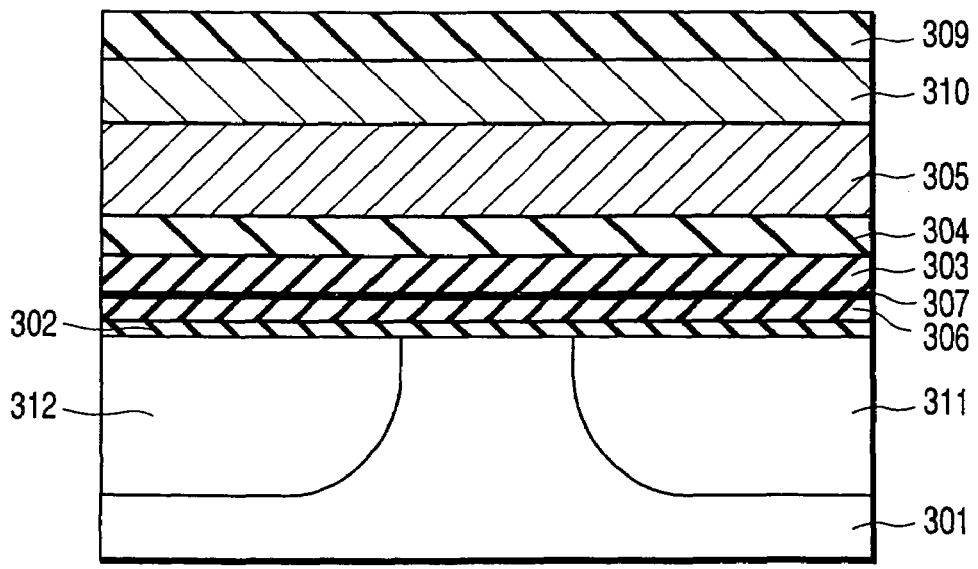
F I G. 20

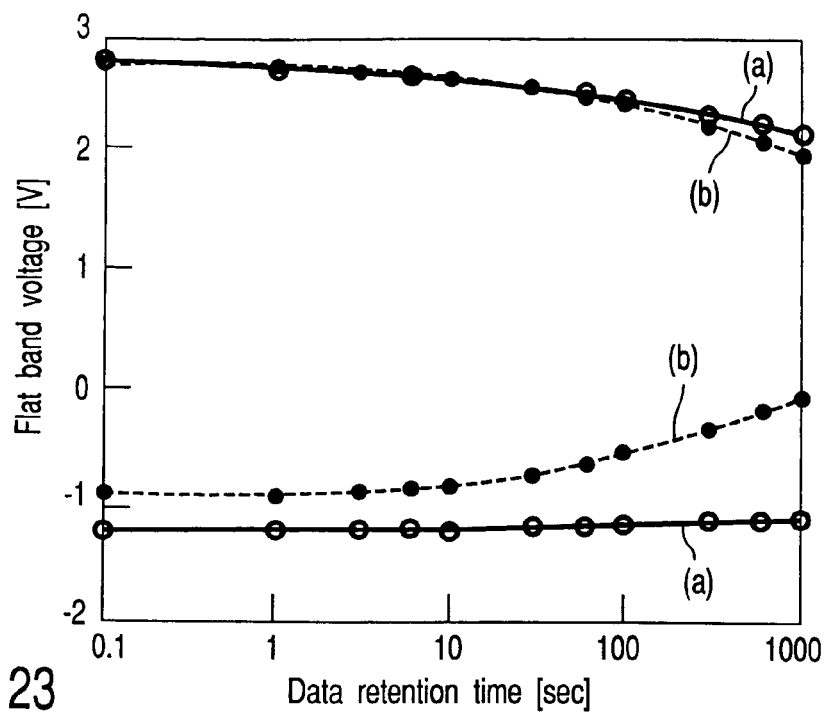
F I G. 23
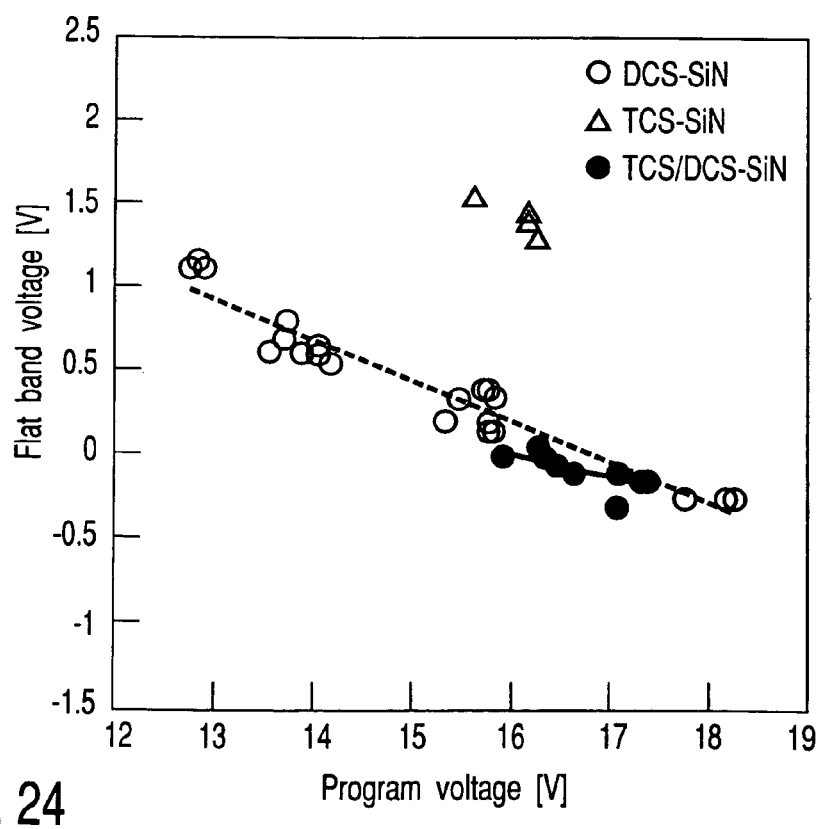
F I G. 24

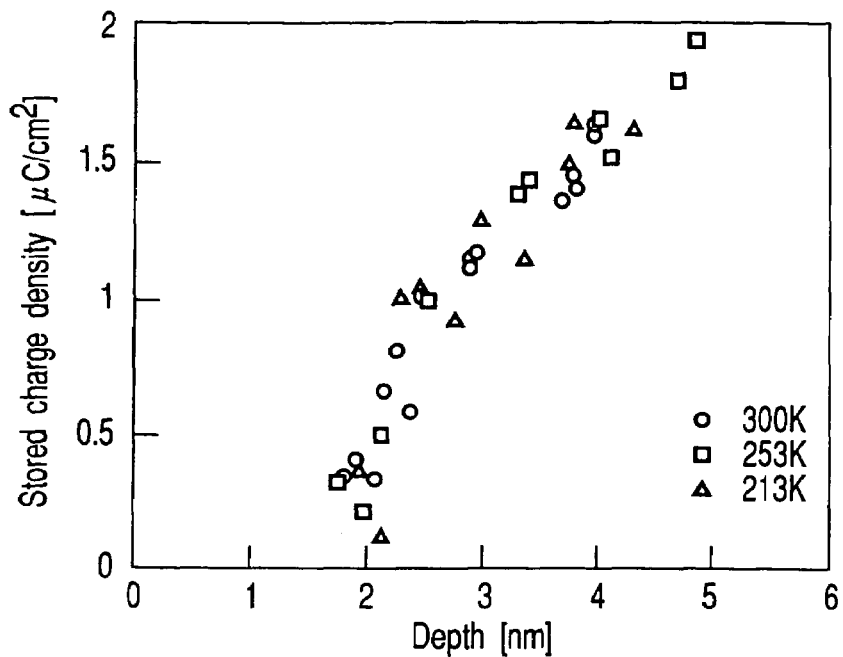
F I G. 25
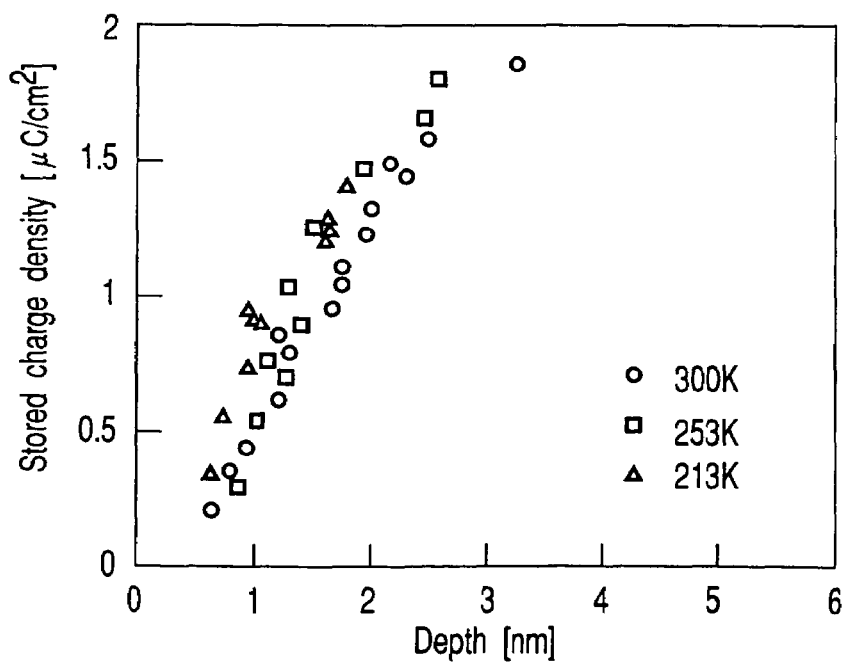
F I G. 26

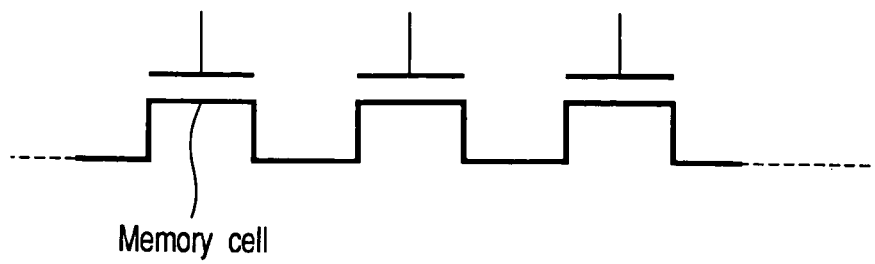
Memory cell
F I G. 27
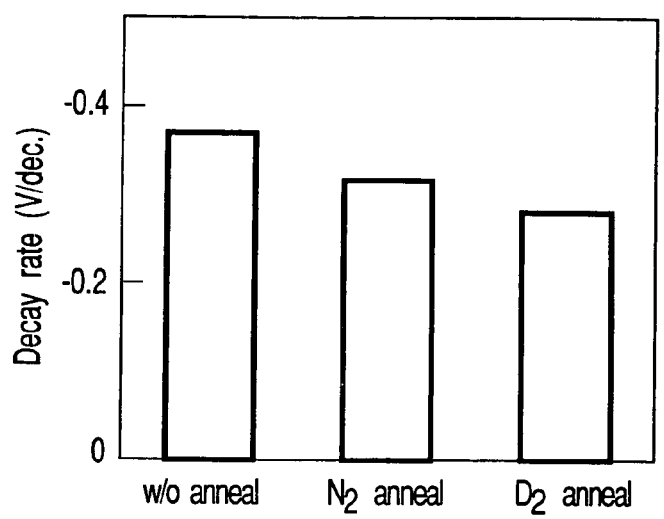
F I G. 28
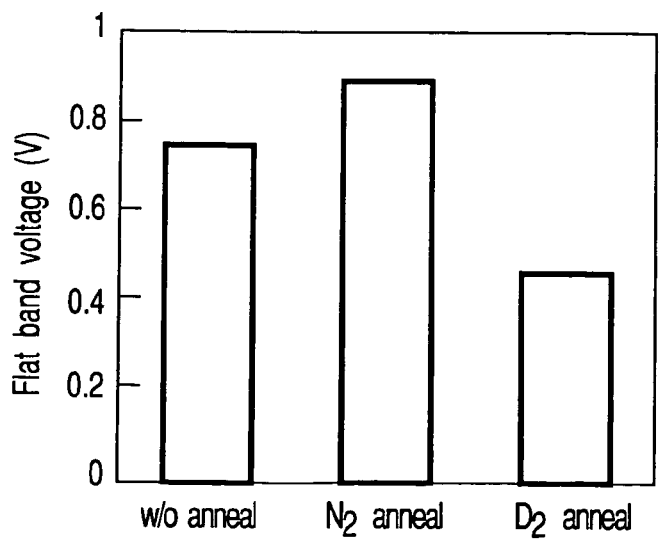
F I G. 29

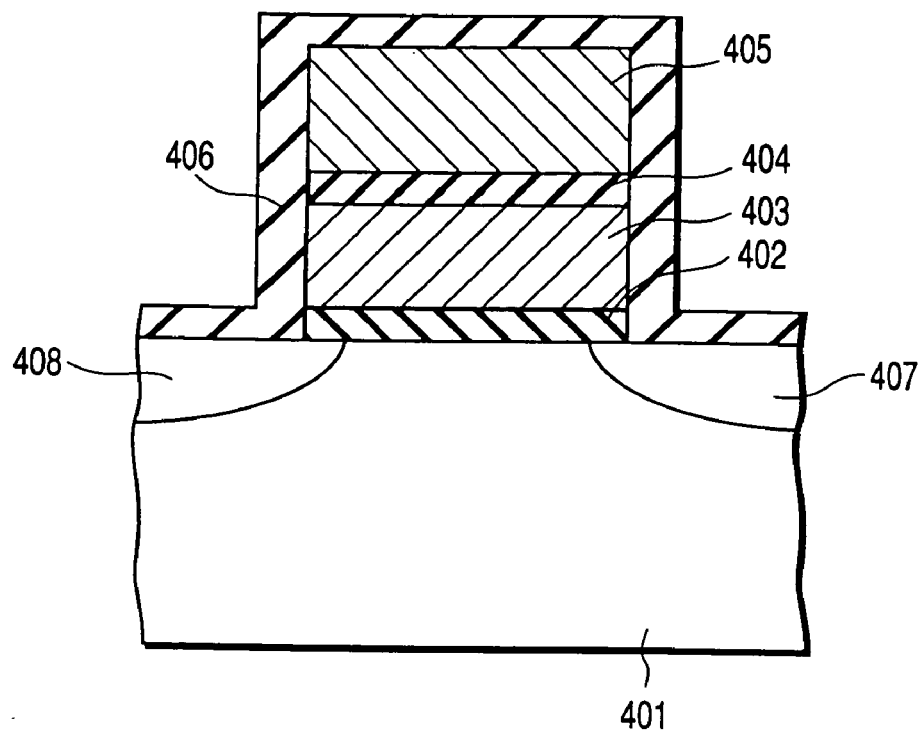
F I G. 32
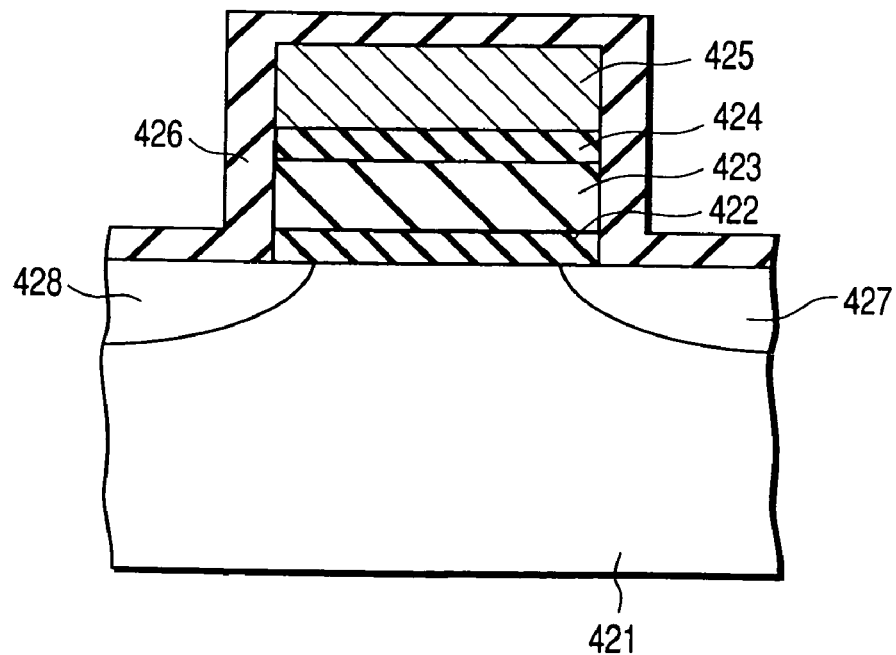
F I G. 33

SEMICONDUCTOR DEVICE AND METHOD OF MANUFACTURING THE SAME

This application is a divisional of application Ser. No. 10/278,882, filed Oct. 24, 2002 now U.S. Pat. No. 6,774,462, upon which this application claims the benefits provided in 35 USC § 120.

CROSS-REFERENCE TO RELATED APPLICATIONS

This application is based upon and claims the benefit of priority from the prior Japanese Patent Application No. 2002-155740, filed May 29, 2002, the entire contents of which are incorporated herein by reference.

BACKGROUND OF THE INVENTION

1. Field of the Invention

The present invention relates to a semiconductor device and a manufacture method thereof, and in particular, to an insulating film provided in a semiconductor device.

2. Description of the Related Art

Silicon nitride films (SiN films) are applied to various parts of a semiconductor device. However, conventional SiN films formed using dichlorosilane ($SiH_2Cl_2$:DCS) may create various problems when they are used to manufacture next-generation semiconductor devices.

Possible problems with a next-generation DRAM employing a dual gate will be described by way of example. In a next-generation DRAM, a thick SiN film of about 200 nm thickness is used as a hard mask used to process an electrode. In the case of an SiN film using DCS (DCS-SiN film), the diffusion of boron is enhanced owing to high temperature steps executed after film formation. Consequently, a PMOS device may be degraded. The degradation of the PMOS device attributed to the SiN film can be suppressed to some degree by taking measures to modify integration. However, such measures may degrade the performance of the transistor and are thus difficult to implement. Accordingly, for more essential solutions, SiN films must be developed which do not contribute to degrading PMOS devices.

The degradation of a device associated with a DCS-SiN film can be prevented using an SiN film (TCS-SiN film) used of tetrachlorosilane ($SiCl_4$:TCS). However, the speed at which the TCS-SiN film is formed is low and about one-third of that of the DCS-SiN film. The film formation speed can be increased by changing film formation conditions (film formation temperature, pressure, and others). However, it is actually difficult to increase the film formation speed because of the need to keep the film uniform, prevent film quality from being degraded, suppress dusts, and the like. Consequently, the use of the TCS-SiN film may reduce productivity.

Further, a MONOS type device using a silicon nitride film as a charge storage layer has been proposed as a cell structure of a next-generation flash memory. The MONOS device comprises a semiconductor substrate, a silicon oxide film (a tunnel oxide film or bottom oxide film), a silicon nitride film (a charge storage layer), a silicon oxide film (a top oxide film), and an electrode sequentially stacked together. This is an M—O—N—O—S structure. An electric write of information is carried out by injecting electrons or holes from the semiconductor substrate into the silicon nitride film through the tunnel oxide film.

A problem with the MONOS device is destruction of data resulting from write/erase stress. Further, a problem with NAND type devices is destruction of data resulting from read stress. Non-volatile memories need to retain charges for 10 years after writes/erases have been carried out 100,000 times. At present, however, data are not sufficiently retained.

In the prior art, Jpn. Pat. Appln. KOKOKU Publication No. 2-59632 discloses a structure using two SiN films containing different amounts of hydrogen, as a charge storage layer. In this case, silane and ammonia are used as film formation gases. Specifically, an SiN film having a larger number of Si—H bonds is provided under an SiN film having a smaller number of Si—H bonds to allow data to be more appropriately retained. However, this structure is not always optimum as described later.

Jpn. Pat. Appln. KOKAI Publication No. 9-64205 discloses a structure using an SiN film as a charge storage layer which has a silicon concentration peak near a top surface of the SiN film, while having a nitrogen concentration peak near a bottom surface thereof. For example, DCS and ammonia are used as film formation gases. Specifically, the concentrations of silicon and nitrogen are adjusted by implanting silicon and nitrogen ions into a single layer SiN film. However, the SiN film is a single layer formed using DCS or the like, and this structure is not always optimum.

Jpn. Pat. Appln. KOKOKU Publication No. 5-48631 discloses a structure in which a silicon oxynitride film is formed on a side of a bottom oxide film as a charge storage layer. Such a structure allows data to be more appropriately retained. However, this is not always optimum as described later.

Further, for non-volatile memories such as flash memories, a tunnel insulating film is desired to be thinner in order to accommodate the continuously reduced thickness of devices. If a silicon oxide film or a silicon oxynitride film is used as a tunnel insulating film, a leakage current may be generated by a mechanism known as direct tunneling when a low electric field of at most 5 MV/cm is applied. This hinders data from being appropriately retained.

Thus, to reduce the low-electric-field leakage current, it has been proposed that a silicon nitride film be used as a tunnel insulating film (Non-Volatile Semiconductor Memory Workshop 1998, p. 95–97, and Non-Volatile Semiconductor Memory Workshop 2001, p. 67–69). However, in spite of the excellent initial characteristics of this film, a gradually increasing low-electric-field leakage current called an "SILC (Stress Induced Leakage Current)" may be generated therein as the number of writes/erases increases. Consequently, this film cannot sufficiently retain data.

As described above, the problem with the formation of a silicon nitride film using DCS can be solved using TCS. However, the use of TCS hinders the film formation speed from being increased, thus reducing productivity.

Further, the non-volatile memory device has been proposed which uses a silicon nitride film as a charge storage layer. However, the corresponding conventional structure does not allow data to be sufficiently retained.

Furthermore, it has been proposed that a silicon nitride film be used as a tunnel insulating film of a non-volatile memory device. However, the corresponding conventional structure does not allow data to be sufficiently retained.

BRIEF SUMMARY OF THE INVENTION

According to a first aspect of the present invention, there is provided a semiconductor device comprising: a semiconductor substrate; a gate electrode; a first insulating film formed between the semiconductor substrate and the gate electrode; and a second insulating film formed along a top surface or a side surface of the gate electrode and including a lower silicon nitride film containing nitrogen, silicon and hydrogen, and an upper silicon nitride film formed on the lower silicon nitride film and containing nitrogen, silicon and hydrogen; and wherein a composition ratio N/Si of nitrogen (N) to silicon (Si) in the lower silicon nitride film is higher than that in the upper silicon nitride film.

According to a second aspect of the present invention, there is provided a semiconductor device comprising: a semiconductor substrate; a gate electrode; a first insulating film formed between the semiconductor substrate and the gate electrode; and a second insulating film formed near the gate electrode and including a lower silicon nitride film containing nitrogen, silicon and hydrogen and an upper silicon nitride film formed on the lower silicon nitride film and containing nitrogen, silicon and hydrogen; and wherein a concentration of hydrogen contained in the lower silicon nitride film is higher than a concentration of hydrogen contained in the upper silicon nitride film.

According to a third aspect of the present invention, there is provided a semiconductor device comprising: a plurality of memory cells connected in series and each comprising: a semiconductor substrate including a source region, a drain region, and a channel region sandwiched between the source region and the drain region; a first insulating film formed on the semiconductor substrate; a second insulating film formed on the first insulating film and storing charges injected from the semiconductor substrate through the first insulating film, the second insulating film including a lower silicon nitride film having a thickness of at least 1 nm and at most 4 nm and an upper silicon nitride film formed on the lower silicon nitride film; a third insulating film formed on the second insulating film; and a control gate electrode formed on the third insulating film.

According to a fourth aspect of the present invention, there is provided a semiconductor device comprising: a semiconductor substrate including a source region, a drain region and a channel region sandwiched between the source region and the drain region; a first insulating film formed on the semiconductor substrate; a second insulating film formed on the first insulating film and storing charges injected from the semiconductor substrate through the first insulating film, the second insulating film including a lower silicon nitride film having a thickness of at least 1 nm and at most 4 nm and an upper silicon nitride film formed on the lower silicon nitride film; a third insulating film formed on the second insulating film; and a control gate electrode formed on the third insulating film; and wherein the second insulating film has a first region located near the source region and a second region located near the drain region, and charges are to be stored independently in the first region and in the second area.

According to a fifth aspect of the present invention, there is provided a method of manufacturing a semiconductor device comprising: forming a first insulating film on a semiconductor substrate; forming a second insulating film on a region including the first insulating film; and wherein forming the second insulating film comprises: forming a first silicon nitride film using a first silicon source containing tetrachlorosilane and a first nitrogen source; and forming a second silicon nitride film on the first silicon nitride film using a second silicon source other than tetrachlorosilane and a second nitrogen source.

According to a sixth aspect of the present invention, there is provided a semiconductor device comprising: a semiconductor substrate; a gate electrode; a first insulating film formed between the semiconductor substrate and the gate electrode; and a second insulating film formed near the gate electrode and including a silicon nitride film containing nitrogen, silicon and hydrogen; and wherein a ratio of the number of deuterium atoms to the number of hydrogen atoms contained in the silicon nitride film is at least 0.9.

According to a seventh aspect of the present invention, there is provided a method of manufacturing a semiconductor device comprising: forming a first insulating film on a semiconductor substrate; and forming a second insulating film on a region including the first insulating film; and wherein forming the second insulating film includes forming a silicon nitride film using a silicon source and a nitrogen source containing deuterium.

According to an eighth aspect of the present invention, there is provided a semiconductor device comprising: a semiconductor substrate; a control gate electrode; a silicon nitride film formed between the semiconductor substrate and the control gate electrode and containing silicon, nitrogen and deuterium boned to nitrogen; and a charge storage film formed between the control gate electrode and the silicon nitride film and storing charges injected from the semiconductor substrate through the silicon nitride film.

BRIEF DESCRIPTION OF THE SEVERAL VIEWS OF THE DRAWING

FIG. 1 is a sectional view partially showing a manufacture method for a semiconductor device according to a first embodiment of the present invention;

FIG. 2 is a sectional view partially showing the manufacture method for a semiconductor device according to the first embodiment of the present invention;

FIG. 6 is a chart showing the relationship between the N/Si composition ratio and a leakage current of an SiN film according to an embodiment of the present invention;

FIG. 7 is a chart showing the relationship between the N/Si composition ratio and density of an SiN film according to an embodiment of the present invention;

FIG. 11 is a sectional view partially showing the manufacture method for a semiconductor device according to the second embodiment of the present invention;

FIG. 12 is a sectional view partially showing the manufacture method for a semiconductor device according to the second embodiment of the present invention;

FIG. 17 is a sectional view showing an example of a semiconductor device according to a fifth embodiment of the present invention;

FIG. 18 is a sectional view showing another example of a semiconductor device according to the fifth embodiment of the present invention;

FIG. 19 is a sectional view showing yet another example of a semiconductor device according to the fifth embodiment of the present invention;

FIG. 20 is a sectional view showing still another example of a semiconductor device according to the fifth embodiment of the present invention;

FIG. 23 is a chart showing the relationship between a data retention time and a flat band voltage according to an embodiment of the present invention;

FIG. 24 is a chart showing the relationship between a program voltage and the flat band voltage according to an embodiment of the present invention;

FIG. 25 is a chart showing the relationship between the depth of the center of gravity of stored charges and the density thereof according to an embodiment of the present invention;

FIG. 26 is a chart showing the relationship between the depth of the center of gravity of stored charges and the density thereof according to a comparative example of an embodiment of the present invention;

FIG. 27 is an electric circuit diagram showing the configuration of a NAND type device according to an embodiment of the present invention;

FIG. 28 is a chart showing the effects of deuterium annealing according to an embodiment of the present invention;

FIG. 29 is a chart showing the effects of deuterium annealing according to an embodiment of the present invention;

FIG. 32 is a sectional view showing the structure of a semiconductor device according to an eighth embodiment of the present invention; and FIG. 33 is a sectional view showing the structure of a semiconductor device according to a ninth embodiment of the present invention.

DETAILED DESCRIPTION OF THE INVENTION

Figure 3:
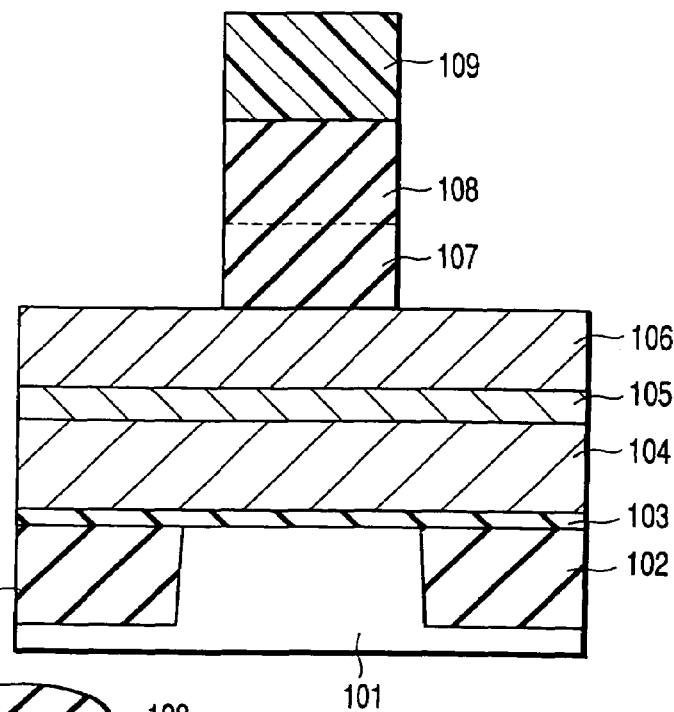
FIG. 3 is a sectional view partially showing the manufacture method for a semiconductor device according to the first embodiment of the present invention.

Embodiments of the present invention will be described below with reference to the drawings.

[Embodiment 1]

FIGS. 1 to 5 are sectional views showing a manufacture method for a semiconductor device (MIS transistor) according to a first embodiment of the present invention.

First, as shown in FIG. 1, an isolation region 102 and a gate insulating film 103 are formed on a silicon substrate 101. The gate insulating film 103 is a silicon oxynitride film of 4.5 nm thickness. Subsequently, a stacked structure composed of an amorphous silicon film 104 (70 nm), a tungsten nitride film 105 (5 nm), and a tungsten film 106 (40 nm) is formed on the gate insulating film 103 as a gate electrode. The amorphous silicon film 104 is doped with p-type impurities in a PMOS region and with n-type impurities in an NMOS region. For example, boron ions are implanted in the PMOS region at 5 keV over $5 \times 10^{14}$ to $1 \times 10^{16}$ cm$^{-2}$, and phosphorous ions are implanted in the NMOS region at 10 keV over $5 \times 10^{14}$ to $1 \times 10^{16}$ cm$^{-2}$. Thus, the amount of boron introduced into the PMOS gate electrode is more than $1 \times 10^{19}$/cm$^3$ and less than $1 \times 10^{21}$/cm$^3$.

Next, as shown in FIG. 2, silicon nitride films (SiN films) 107 and 108 are formed by low pressure chemical vapor deposition (LP-CVD) so as to have a total thickness of 200 nm. The SiN films 107 and 108 constitute a hard mask used to process the gate electrode. The SiN films 107 and 108 are formed in the following manner:

First, the SiN film 107 is formed using tetrachlorosilane (SiCl$_4$:TCS) and ammonia (NH$_3$). The film formation conditions include a temperature of 700 to 900° C., a pressure of 0.01 to 10 Torr, and a ratio of TCS flow rate to NH$_3$ flow rate of 0.01 to 10. An SiN film using TCS (TCS-SiN film) is formed at 1 nm/min. The film formation time is 80 minutes. The SiN film 107 obtained has a thickness of 80 nm. Subsequently, the SiN film 108 is formed using dichlorosilane (SiH$_2$Cl$_2$:DCS) and ammonia (NH$_3$). The film formation conditions include a temperature of 600 to 900° C., a pressure of 0.01 to 10 Torr, and a ratio of DCS flow rate to NH$_3$ flow rate of 0.01 to 10. An SiN film using DCS (DCS-SiN film) is formed at 3.2 nm/min. The film formation time is 40 minutes. The SiN film 108 obtained has a thickness of 120 nm. The TCS-SiN film 107 and the DCS-SiN film 108 are consecutively formed in the same furnace in this order without exposing the substrate to the air.

Then, as shown in FIG. 3, a resist film 109 is formed which is patterned using a photolithography technique. Subsequently, the SiN films 107 and 108 are dry-etched using the resist 109 as a mask. Thereafter, the resist 109 is removed.

Figure 4:
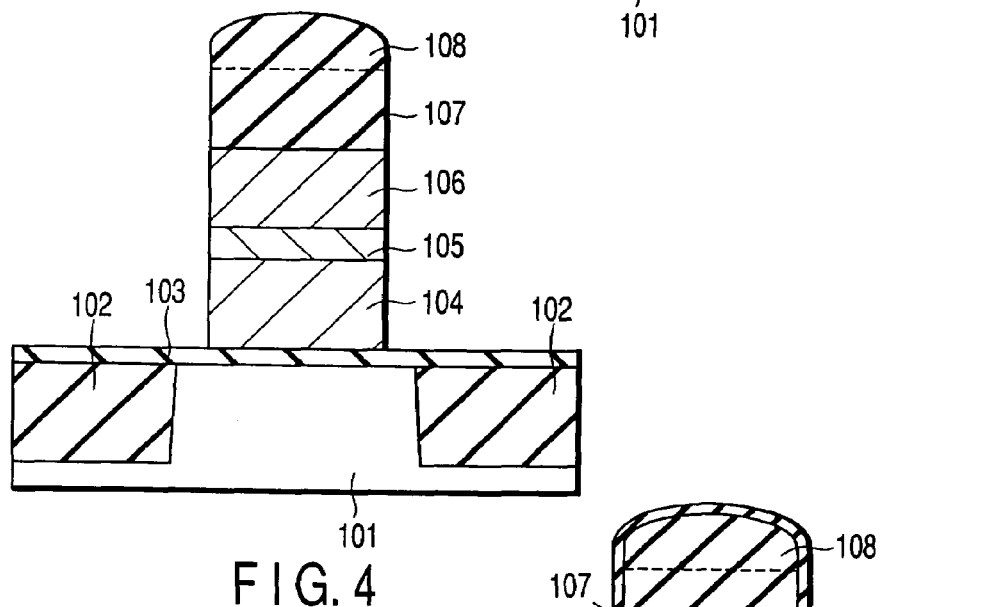
FIG. 4 is a sectional view partially showing the manufacture method for a semiconductor device according to the first embodiment of the present invention.

Then, as shown in FIG. 4, the tungsten film 106, the tungsten nitride film 105, and the amorphous silicon film 104 are sequentially etched using a normal dry etching technique and using the SiN films 107 and 108 as a hard mask. At this time, the top of the SiN film 108 is cut by dry etching, so that the total thickness of the SiN films 107 and 108 becomes about 130 nm.

The reason why the two SiN films are formed will be explained.

After the SiN forming step, a high temperature step for activating impurities is executed a plurality of times. If only a DCS-SiN film is formed on the electrode during this high temperature step, the PMOS device may be degraded. This is because the high temperature step causes boron to penetrate the gate insulating film and diffuse to the silicon substrate. The diffusion of boron attributed to the SiN films can be suppressed by applying TCS-SiN (refer to M. Tanake et al., 10-1, 2001 Symposium on VLSI Symposium, Digest of Technical Papers). That is, the use of TCS-SiN suppresses the diffusion of boron without affecting the characteristics of the device.

However, the use of only the TCS-SiN film significantly reduces productivity. The film formation speed for the TCS-SiN film is about one-third of that for DCS-SiN. For example, it takes about 200 minutes to form a 200-nm SiN film using TCS. This is much more unproductive than the use of a DCS (about 60 minutes). Further, TCS has four chlorine atoms per TCS molecule, so that a double amount of $NH_4Cl$ is generated from a chemical reaction with TCS compared to a chemical reaction with DCS. Since $NH_4Cl$ is a solid, it may damage an exhaust system of the apparatus used. That is, a pipe may be blocked with $NH_4C_1$ and $NH_4Cl$ may adhere to the interior of a vacuum pump as dusts. Thus, the use of TCS may markedly increase the frequency of maintenance to reduce productivity. Consequently, although TCS is essential in implementing high-performance devices, it may disadvantageously reduce productivity.

Now, referring to FIG. 4, the SiN film, which was formed so as to have a thickness of 200 nm, is only about 130 nm in thickness after the gate electrode has been formed. This indicates that a thickness of 200 nm need not be achieved using only TCS. Thus, productivity can be increased by using TCS during an initial period of film formation that affects electrical characteristics and using DCS during a latter period of film formation that allows the SiN films to function substantially as masks. It should be noted that TCN-SiN must be formed so as to have such a thickness as prevents the degradation of the PMOS device resulting from the diffusion of boron. That is, the characteristics of the device and the productivity are traded off with each other.

The results of examinations of the correlationship between the film thickness ratio of the two SiN films and the device characteristics indicate that no problems occur with the characteristics of the device if the TCS and DCS layers have thicknesses of 80 and 120 nm, respectively, that is, if the ratio of TCS to DCS is 0.67. In the above described example, the time required to form a film using only TCS can be reduced by about 40%.

After the gate electrode has been formed, side walls are oxidized. The post oxidation is carried out at 800° C. for 30 minutes in an atmosphere in which nitrogen, hydrogen, and water are mixed together because the tungsten film 106 is exposed.

Figure 5:
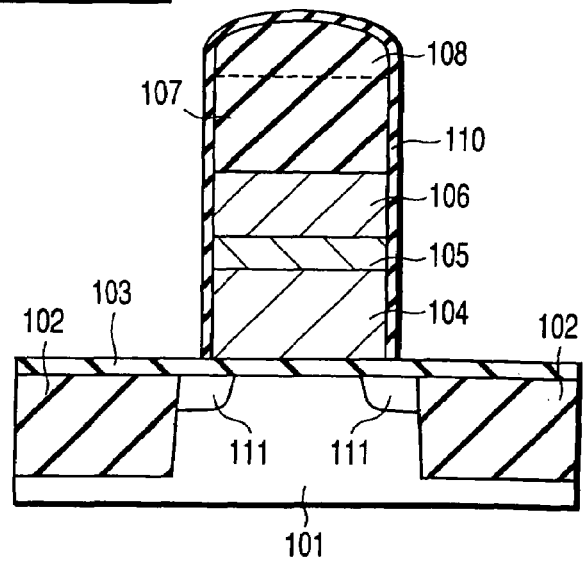
FIG. 5 is a sectional view partially showing the manufacture method for a semiconductor device according to the first embodiment of the present invention.

Then, as shown in FIG. 5, impurity ions are implanted in a source/drain region 111 in a cell region and the NMOS and PMOS regions using a patterned resist (not shown) as a mask. Furthermore, to activate the impurities, annealing is carried out in a nitrogen atmosphere at 850° C. for 10 seconds.

Then, an insulating SiN film 110 is formed so as to have a thickness of 20 nm. The SiN film 110 prevents the leakage between the gate electrode and a contact electrode (not shown) connected to the source/drain region 111. First, a lower SiN film of 10 nm thickness is formed using TCS. Subsequently, an upper SiN film of 10 nm thickness is formed using DCS. The TCS-SiN film and the DCS-SiN film are consecutively formed in this order without exposing the substrate to the air. The film formation conditions include a film formation temperature of 700° C., a film formation pressure of 0.5 Torr, a silicon source (DCS or TCS) flow rate of 100 sccm, and an ammonia flow rate of 1000 sccm. Film formation speeds achieved under these film formation conditions are 0.8 nm/min for DCS and 0.3 nm/min for TCS. Subsequently, dry etching is carried out to remove the SiN film at the bottom surface to selectively leave the SiN film 110 around the gate electrode.

The SiN film 110 is in direct contact with the silicon film 104, doped with boron. Thus, for the reason described previously, it is effective to apply a stacked structure composed of a TCS-SiN film and a DCS-DIN film. The results of examinations indicate that the diffusion of boron can be sufficiently suppressed if both TCS and DCS layers have a thickness of 10 nm (the film thickness ratio is 1.0). Thus, if the film thickness ratio of TCS to DCS is at most 1.0, productivity can be increased, while suppressing the diffusion of boron.

Further, the use of the TCS-SiN film reduces leakage. The TCS-SiN film has a higher N/Si composition ratio than the DCS-SiN film. That is, the TCS SiN film contains a larger amount of nitrogen than the DCS SiN film, and is close to stoichiometry.

FIG. 6 shows the relationship between the N/Si composition ratio of the SiN film and a leakage current therefrom. The N/Si composition ratio of the TCS-SiN film is about 1.34, whereas the N/Si composition ratio of the DCS-SiN film is about 1.30. This figure indicates the leakage current decreases as the N/Si composition ratio increases to approach the stoichiometry of a silicon nitride film (4/3).

FIG. 7 shows the relationship between the N/Si composition ratio and density of the SiN film. The TCS-SiN film has a density of about 2.62 $g/cm^3$, whereas the DCS-SiN film has a density of about 2.76 $g/cm^3$. This figure indicates the density decreases with increasing N/Si composition ratio. Further, owing to its lower density, the TCS-SiN film has a smaller dielectric constant (6.8) than the DCS-SiN film (7.4). Accordingly, the use of the TCN-SiN film reduces parasitic capacitance.

However, if the SiN film 110, shown in FIG. 5, is formed only of a TCS-SiN film, the leakage current cannot be reduced. Since the contact electrode is formed near the gate electrode, the polysilicon film 104 is in contact with the TCS-SiN film. After the contact electrode has been formed, a high temperature step is executed for activation. The TCS-SiN film contains an excess amount of nitrogen and is thus highly reactive with polysilicon. Thus, the high temperature step causes nitrogen in the TCS-SiN film to diffuse to the polysilicon side. As a result, if the SiN film 110 has a single layer structure composed of a TCS-SiN film, the leakage current disadvantageously increases after the high temperature step.

In this example, the DCS-SiN film is formed after the TCS-SiN film, so that the reactivity between the SiN film 110 and the polysilicon film 104 can be reduced, thereby reducing the leakage current. Further, the stacked structure composed of the TCS-SiN and DCS-SiN films serves to reduce the film formation time by about 40% compared to the film formed only of TCS-SiN.

As described above, in this embodiment, the use of the two-layer structure composed of the lower TCS-SiN film and the upper DCS-SiN film suppresses the diffusion of boron and reduces the leakage current, while increasing the productivity.

The aspects described below can be used for the lower and upper SiN films. These aspects are similarly applicable to a second to seventh embodiments, described later.

As shown in FIGS. 6 and 7, the N/Si composition ratio of the TCS-SiN film is about 1.34, whereas the N/Si composition ratio of the DCS-SiN film is about 1.30. Accordingly, preferably, the N/Si composition ratio of the lower SiN film is higher than 1.32, whereas the N/Si composition ratio of the upper SiN film is lower than 1.32. Further, the SiN film has a density of about 2.68 g/cm$^3$ when its composition ratio N/Si is 1.32. Consequently, preferably, the density of the lower SiN film is lower than 2.68 g/cm$^3$, whereas the density of the upper SiN film is higher than 2.68 g/cm$^3$.

Further, as described later (see FIG. 21), the concentration of the hydrogen contained in the TCS-SiN film is about 7×10$^{21}$/cm$^3$, whereas the concentration of the hydrogen contained in the DCS-SiN film is about 3×10$^{21}$/cm$^3$. Accordingly, preferably, the concentration of the hydrogen contained in the lower SiN film is higher than 5×10$^{21}$/cm$^3$, whereas the concentration of the hydrogen contained in the upper SiN film is lower than 5×10$^{21}$/cm$^3$. The hydrogen may include isotopes thereof such as deuterium (D).

Further, TCS and DCS contain chlorine, so that the TCS-SiN and DCS-SiN films also contain chlorine. These films normally have a chlorine concentration of higher than 1×10$^{19}$/cm$^3$.

Furthermore, DCS has Si—H bonds, whereas TCS has no Si—H bonds. Thus, the DCS-SiN film has a large number of Si—H bonds, while the TCS-SiN film has a small number of Si—H bonds. The results of analysis using a Fourier transform type infrared absorption method (FT-IR method) indicate that the Si—H bonds in the DCS-SiN film are higher than 1×10$^{20}$/cm$^3$ in density, whereas no Si—H bonds are observed in the TCS-SiN film. Accordingly, the Si—H bonds in the TCS-SiN film are expected to be lower than 1×10$^{20}$/cm$^3$ in density.

Further, the lower and upper SiN films may contain oxygen. However, preferably, the lower and upper SiN films are consecutively formed in this order without being exposed to the air. In this case, as described later (see FIG. 22), the concentration of oxygen at the interface between the lower and upper SiN films is lower than 1×10$^{22}$/cm$^3$.

Furthermore, the upper SiN film may be composed of an SiN film formed using silane (SiH$_4$) or hexachlorodisilane (HCD:Si$_2$Cl$_6$) in place of DCS.

[Embodiment 2]

FIGS. 8 to 12 are sectional views showing a manufacture method for a semiconductor device (MIS transistor) according to a second embodiment of the present invention.

Figure 8:
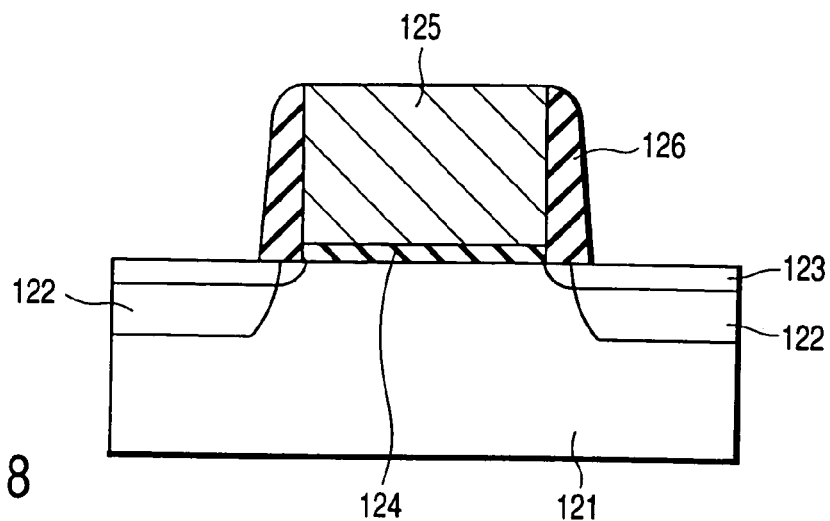
FIG. 8 is a sectional view partially showing a manufacture method for a semiconductor device according to a second embodiment of the present invention.

First, as shown in FIG. 8, the following components are formed on a silicon substrate 121 using a normal method: an isolation region (not shown), a gate insulating film 124, a gate electrode 125, a side wall insulating film 126, an extension region 123, and a source/drain region 122. The gate electrode 125 is formed of an amorphous silicon film. The amorphous silicon film is doped with p-type impurities in a PMOS region and with n-type impurities in an NMOS region. The impurities are implanted in the amorphous silicon film simultaneously with the implantation of ions in the source/drain region 122. For example, boron ions are implanted in the PMOS region at 7 keV over 5×10$^{14}$ to 1×10$^{16}$ cm$^{-2}$, and arsenic ions are implanted in the NMOS region at 65 keV over 5×10$^{14}$ to 1×10$^{16}$ cm$^{-2}$. The side wall insulating film 126 is a silicon oxide film (SiO$_2$ film) formed using TEOS. Thus, the amount of boron introduced into the PMOS gate electrode is more than 1×10$^{19}$/cm$^3$ and less than 1×10$^{21}$/cm$^3$.

Figure 9:
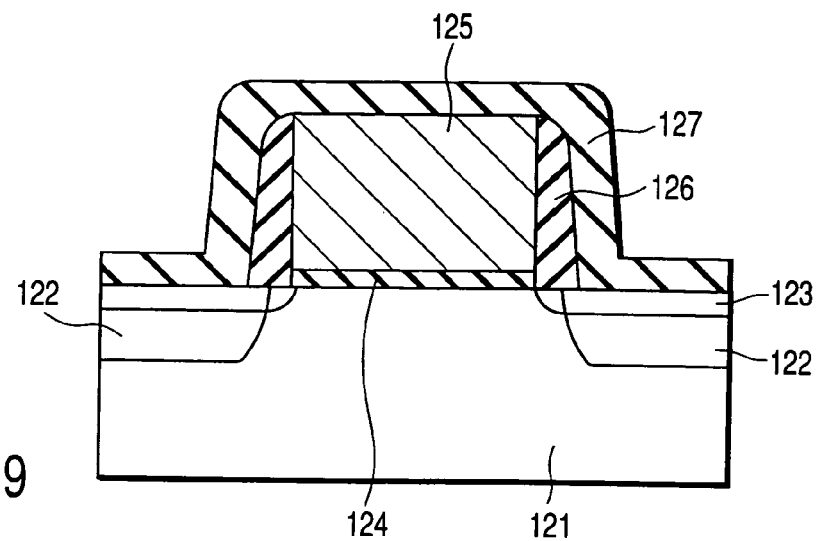
FIG. 9 is a sectional view partially showing the manufacture method for a semiconductor device according to the second embodiment of the present invention.

Next, as shown in FIG. 9, an LPCVD process is used to form an SiN film 127 so as to have a thickness of 70 nm. The SiN film 127 has a stacked structure composed of a lower TCS-SiN film and an upper DCS-SiN film. First, the lower SiN film is formed using TCS. The film formation conditions include a temperature of 700 to 900° C., a pressure of 0.01 to 10 Torr, and a TCS/NH$_3$ flow rate ratio of 0.01 to 10.

A TCS-SiN film is formed at 1 nm/min. The film formation time is 20 minutes. The TCS-SiN film obtained has a thickness of 20 nm. Subsequently, the upper SiN film is formed using DCS. The film formation conditions include a temperature of 600 to 900° C., a pressure of 0.01 to 10 Torr, and a DCS/NH$_3$ flow rate ratio of 0.01 to 10. A DCS-SiN film is formed at 3.2 nm/min. The film formation time is 16 minutes. The SiN form obtained has a thickness of 50 nm. The TCS-SiN film and the DCS-SiN film are consecutively formed in this order without exposing the substrate to the air.

Figure 10:
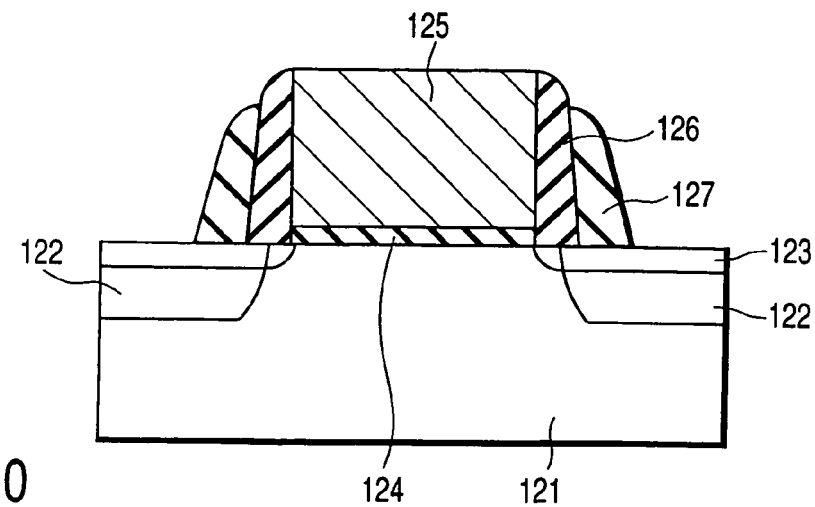
FIG. 10 is a sectional view partially showing the manufacture method for a semiconductor device according to the second embodiment of the present invention.

Then, as shown in FIG. 10, a dry etching technique is used to selectively leave the SiN film 127 on side walls of the gate electrode. The SiN film 127 remaining on the side walls has a maximum thickness of about 50 nm. The side wall SiN film 127 functions as a silicide block and as an etching stopper for chemical processing. That is, the side wall SiN film 127 suppresses the bridging reaction between the gate electrode 125 and cobalt silicide on the source-drain region 122, and hinders an increase in junction leakage. Without the side wall SiN film 127, a process executed before a cobalt silicide step may cause the TEOS-SiO$_2$ film to move backward. In this case, cobalt silicide may be formed up to the neighborhood of the electrode, thereby increasing the junction leakage.

Then, as shown in FIG. 11, a cobalt film is formed using a sputtering process. Subsequently, a thermal step at 800° C. for about 30 sec. is executed to cause cobalt and silicon to react with each other to form a cobalt silicide film 128. Furthermore, a part of the cobalt film which has not been silicided is removed, and an LPCVD process is then used to form an SiN film 129 so as to have a thickness of 40 nm. The SiN film 129 functions as an etching stopper when a contact hole is opened.

Then, as shown in FIG. 12, a film formation process using plasma is executed to form a silicon oxide film (TEOS-SiO$_2$ film) 130 of 200 nm thickness as an interlayer insulating film. Moreover, the surface of the silicon oxide film 130 is flattened using a CMP process. Subsequently, a contact hole is formed in a self-align manner using a resist pattern (not shown) and the SiN film 127 as masks. Furthermore, conductive material is buried in the contact hole to form a contact electrode 131.

If the SiN film 127 is formed only of a DCS-SiN film, the diffusion of boron may deplete the gate electrode, increase interface states, reduce resistance to field-temperature stress, or the like. To improve performance, it is essential to form a TCS-SiN film. However, using only a TCS-SiN film may reduce productivity. Thus, in this embodiment, a thin TCS-SiN film is formed which is still thick enough to prevent the performance of the device from being degraded, and then a DCS-SiN film is formed thereon. Also in this embodiment, the film thickness ratio of the TCS-SiN film to the DCS-SiN film can be set to at most 1.0 to increase the productivity, while suppressing the diffusion of boron.

Thus, in this embodiment, the use of the two layer structure composed of the lower TCS-SiN film and the upper DCS-SiN film produces effects similar to those described in the first embodiment.

[Embodiment 3]

Figure 13:
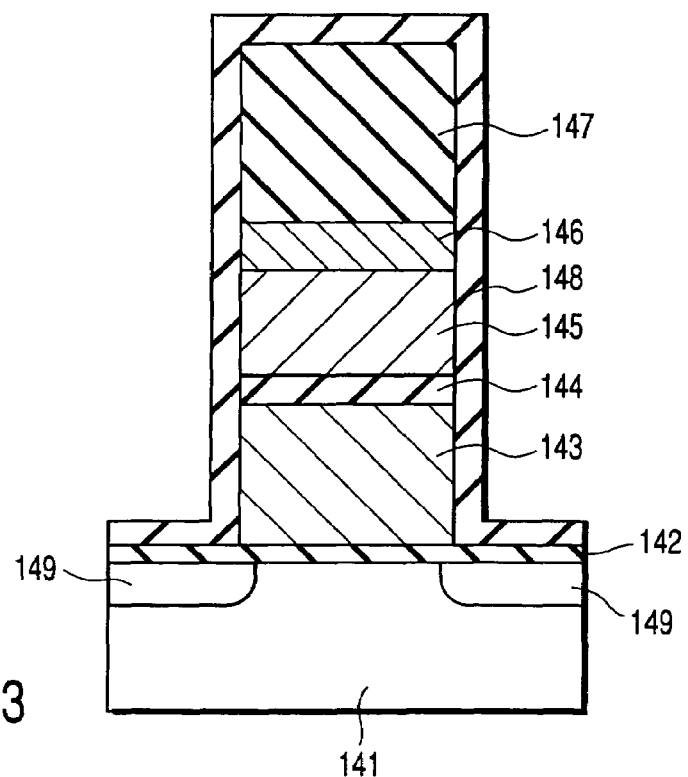
FIG. 13 is a sectional view showing the structure of a semiconductor device according to a third embodiment of the present invention.

FIG. 13 is a sectional view showing the structure of a semiconductor device (a non-volatile memory or flash memory) according to a third embodiment of the present invention.

In FIG. 13, on a silicon substrate 141, the following components are formed: a tunnel insulating film 142, a floating gate 143 acting as a charge storage film, an inter-poly insulating film (an inter-electrode insulating film) 144, a control gate 145 formed of a polysilicon film, and a tungsten silicide film 146. Further, an SiN film 147 is formed on the tungsten silicide film 146, and an SiN film 148 is formed along side walls of a gate structure. At least one of the SiN film included in the inter-electrode insulating film 144, the SiN film 147, and the SiN film 148 has a stacked structure composed of a lower TCS-SiN film and an upper DCS-SiN film. Furthermore, source/drain diffusion layers 149 are formed so as to sandwich a gate structure.

This embodiment also produces effects similar to those described in the first embodiment. This embodiment also suppresses the degradation of the tunnel insulating film resulting from a high temperature thermal step executed after the SiN film has been formed, as described bellow.

In this case, the SiN film 148, formed on the side walls, will be described. A flash memory requires a high voltage of about 20 V to carry out a write and an erase. Traps frequently occur in the DCS-SiN film. Thus, electrons injected during a write are trapped in the SiN film, thereby disadvantageously varying a threshold voltage. As described previously, small amount of traps occur in the TCS-SiN film as indicated by its N/Si composition ratio close to stoichiometry and its small leakage current. Accordingly, electrons injected during a write are hindered from being trapped in the SiN film by using a TCS-SiN film as a layer contacting with the gate structure. Consequently, a variation in threshold voltage associated with the trapping of electrons during a write can be suppressed by using a TCS-SiN film as a lower layer.

[Embodiment 4]

Figure 14:
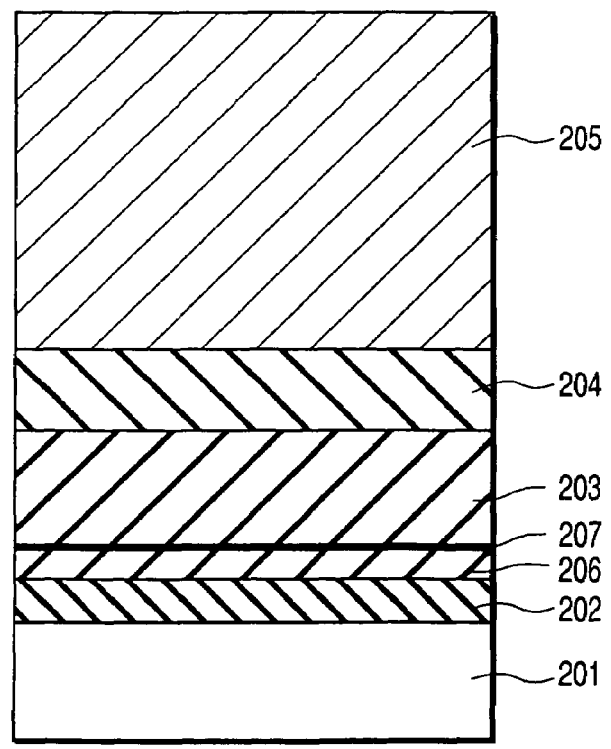
FIG. 14 is a sectional view showing the structure of a semiconductor device according to a fourth embodiment of the present invention.

FIG. 14 is a sectional view showing the structure of a semiconductor device (a MONOS type memory device) according to a fourth embodiment of the present invention.

First, a silicon oxide film 202 is formed on a silicon substrate 201 so as to have a thickness of 0.5 to 10 nm. The silicon oxide film 202 is a tunnel oxide film (bottom oxide film) in a MONOS device. Electrons or holes are injected through the silicon oxide film 202.

Next, a TCS-SiN film 206 of 1 to 4 nm thickness is formed on the silicon oxide film 202 using an LPCVD process without executing any wet preprocesses or the like. The film formation conditions include a temperature of 700 to 900° C., a pressure of 0.01 to 10 Torr, and a TCS/NH$_3$ flow rate ratio of 0.01 to 1. Subsequently, a DCS-SiN film 203 of 2 to 20 nm thickness is formed using the LPCVD process. The film formation conditions include a temperature of 600 to 900° C., a pressure of 0.01 to 10 Torr, and a DCS/NH$_3$ flow rate ratio of 0.01 to 1. Thus, a silicon nitride film having a total thickness of 12 nm is formed as a charge storage film. The TCS-SiN film 206 and the DCS-SiN film 203 are consecutively formed in this order without being exposed to the air. This reduces the concentration of oxygen at an interface region 207 between the DCS-SiN film 203 and the TCS-SiN film 206.

Then, a silicon oxide film (a top oxide film) 204 of 0.5 to 30 nm thickness is formed on the silicon nitride film 203 without executing any wet preprocesses or the like. The silicon oxide film 204 prevents the injection of charges from the electrode and the leakage of charges from the charge storage layer to the electrode. Subsequently, to improve the quality of the top oxide film 204, for example, pyrogenic oxidation is carried out at 800° C. using oxygen and hydrogen. Then, a control electrode 205 is formed on the silicon oxide film 204 without executing any wet preprocesses or the like. For example, a silicon film of 200 nm thickness is formed at a temperature of 600° C. using the LPCVD process and using silane. Subsequently, impurities are introduced into the silicon film. Furthermore, an activation process is executed to form the control electrode 205.

Then, description will be given of the results of measurements of the electrical characteristics of a MONOS device formed using the above method.

Figure 15:
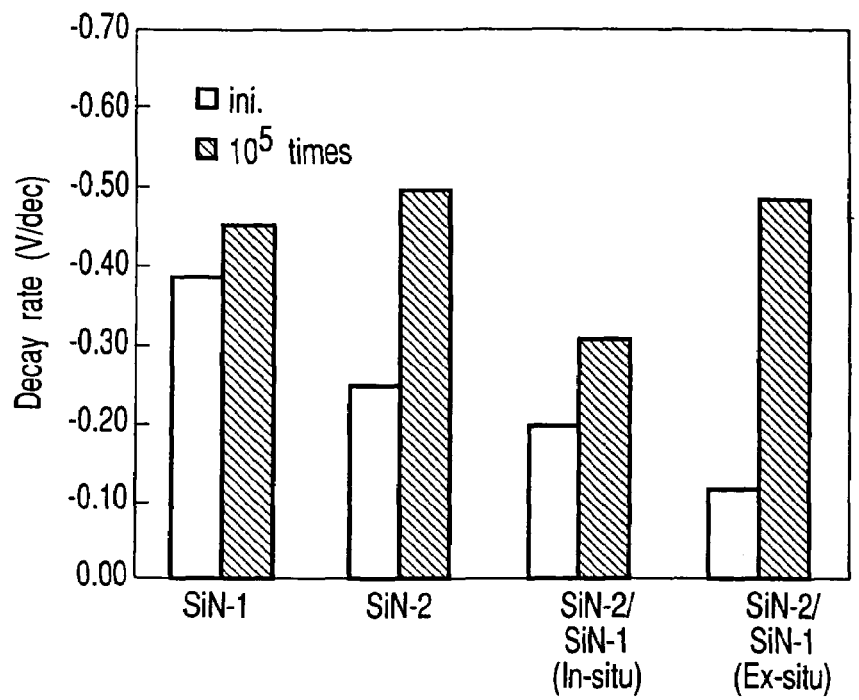
FIG. 15 is a chart showing data retention characteristics of various silicon nitride films according to an embodiment of the present invention.
Figure 16:
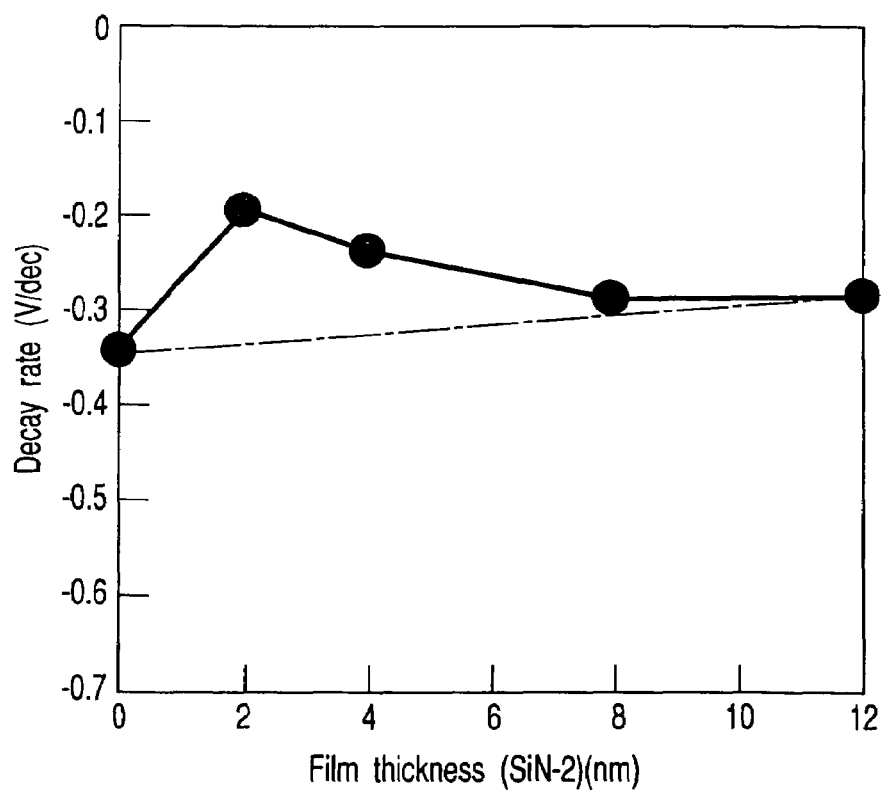
FIG. 16 is a chart showing data retention characteristics of a silicon nitride film when its thickness is varied according to an embodiment of the present invention.

FIGS. 15 and 16 show the results of evaluation of a capacitor (area: 0.01 mm$^2$). A write was carried out so that a flat band voltage change is 3 V, and a data retention characteristic was measured. The data retention characteristic represents the dependency of stored charges on elapsed time. The data retention characteristic is obtained by determining the flat band voltage every predetermined time after a write, using a capacity-voltage (C-V) measurement method.

Charges retained in the silicon nitride film leak toward the substrate over time. Thus, the flat band voltage gradually decreases over time relative to an initial write voltage. The decay rate shown in the figure refers to a variation (V/dec) in flat band voltage per one-order-of-magnitude time. It should be appreciated a more excellent charge storage layer has a lower decay rate. A flash memory must ensure that written information is retained for 10 years, i.e. "0" and "1" can be distinguished from each other 10 years later. Here, it is assumed that 10 years equal 3×10$^8$ sec. and that "0"; and "1" can be distinguished from each other on the basis of a difference of 0.5 V. If the above specification is given in terms of a decay rate, the specification with 3 V write is about 0.3 V/sec.

FIG. 15 shows the results of evaluation of the data retention of four silicon nitride films. SiN-1 denotes the results of evaluation of a silicon-rich silicon nitride film formed only of a DCS-SiN film. SiN-2 denotes the results of evaluation of a silicon nitride film exhibiting substantially stoichiometric characteristics or a nitrogen-rich silicon nitride film that is formed only of a TCS-SiN film. Further, SiN-2/SiN-1 (in-situ) denotes the results of evaluation of the case in which the SiN-2 and SiN-1 are consecutively formed in this order. SiN-2/SiN-1 (ex-situ) denotes the results of evaluation of the case in which the SiN-2 is exposed to the air and the SiN-1 is then formed. These four types of silicon nitride films have an equal total thickness. As is apparent from the results shown in FIG. 15, the SiN-2/SiN-1 (in-situ) retains data most excellently.

First, explanation will be given of the reason why the in-situ case exhibits a more excellent performance than the ex-situ case. Under the ex-situ conditions, a large amount of oxygen is present at the interface between the silicon nitride films. This increases a write/erase voltage. Under the ex-situ conditions, high field stress causes severe degradation after 100,000 writes/erases.

Explanation will be given of the reason why the silicon nitride film formed only of the SiN-2 is severely degraded after 100,00 writes/erases. The SiN-2 has an N/Si composition ratio close to stoichiometry, a low trap density, and a low dielectric constant. This increases the write/erase voltage. Consequently, also in the SiN-2, high field stress causes severe degradation.

In the in-situ stacked film, the SiN-2 formed at the substrate-side interface enables trapped electrons to be moved toward the electrode. Thus, the data retention characteristic is pronouncedly improved. Further, in the in-situ stacked film, the film is mostly formed of the SiN-1, which involves frequent traps, the write/erase voltage does not substantially increase. Consequently, possible field stress during a write/erase can be suppressed. This hinders the film from being degraded after 100,000 writes/erases.

Now, for the in-situ stacked film, the relationship between the thickness of the SiN-2 and the decay rate will be shown. FIG. 16 shows the results of examinations of the relationship between the decay rate and the thickness of the SiN-2, the examinations being carried out by setting the SiN-2/SiN-1 (in-situ) to have an equal total thickness. The axis of ordinates indicates the decay rate, while the axis of abscissas indicates the thickness of the substrate-side silicon nitride film (SiN-2).

When the SiN-2 has a thickness of 8 nm, it has a decay rate equivalent to that of the single-layer SiN-2 film. On the other hand, when the SiN-2 has a thickness of 4 or 2 nm, it has a small absolute value for the decay rate. Accordingly, when the SiN-2 is at most 4 nm in thickness, the effects of the stacked structure become significant. This is assumed to be because the SiN-2 serves to move stored electrons away from the substrate and because electrons can be efficiently trapped in the SiN-1.

As described above, in this embodiment, the use of the stacked structure composed of the lower TCS-SiN film and upper DCS-SiN film provides a semiconductor device that can excellently retain data.

[Embodiment 5]

FIG. 17 is a sectional view showing the structure of a semiconductor device (a MONOS type memory device) according to a fifth embodiment of the present invention.

A silicon substrate 301 is of a p type and contains about $10^{14}$ to $10^{19}$ cm$^{-3}$ of impurities (boron or indium).

A bottom insulating film (a tunnel insulating film) 302 of 0.5 to 10 nm thickness is formed on the silicon substrate 301. The bottom insulating film 302 is composed of a silicon oxide film or a silicon oxynitride film. A TCS-SiN film 306 is formed on the bottom insulating film 302 so as to have a thickness of at least 1 nm and at most 4 nm. A DCS-SiN film 303 is formed on the TCS-SiN film 306 so as to have a thickness of at least 2 nm and at most 20 nm. The stacked structure of the TCS-SiN film 306 and DCS-SiN film 303 constitutes a charge storage film. Reference numeral 307 denotes an interface region between the TCS-SiN film 306 and the DCS-SiN film 303. A block insulating film (top insulating film) 304 is formed on the charge storage film so as to have a thickness of at least 5 nm and at most 30 nm. The block insulating film 304 is composed of a silicon oxide film or a silicon oxynitride film. The bottom insulating film 302, charge storage film, and block insulating film 304 constitute an ONO stacked film.

A gate electrode (control electrode) 305 of 10 to 500 nm thickness is formed on the block insulating film. The gate electrode 305 is composed of a polysilicon film containing about $1\times10^{19}$ to $1\times10^{21}$ cm$^{-3}$ of impurities (arsenic, phosphorous, or boron). If the concentration of the impurities in the polysilicon film is at least $1\times10^{19}$ cm$^{-3}$, the gate electrode 305 is depleted to reduce an electric field applied to the ONO stacked film. This prevents an increase in erase time.

The gate electrode 305 has a metallic conductive film 310 formed thereon so as to have a thickness of 5 to 500 nm and composed of WSi (tungsten silicide), NiSi (nickel silicide), MoSi (molybdenum silicide), TiSi (titanium silicide), CoSi (cobalt silicide), W, or Al. The metallic conductive film 310 has gate wiring to which a plurality of gate electrodes are connected.

An upper insulating film 309 composed of a silicon nitride film or a silicon oxide film is formed on the metallic conductive film 310 so as to have a thickness of 5 to 500 nm. The gate electrode 305 has a side wall insulating film 308 formed on side walls thereof so as to have a thickness of 2 to 200 nm and composed of a silicon nitride film or a silicon oxide film. The side wall insulating film 308 and the insulating film 309 maintains electric insulation between the gate electrode 305 and all of a source/drain region, a contact (not shown), and an upper wiring layer (not shown).

After the side wall insulating film 308 has been formed, n-type impurity ions are implanted in the silicon substrate 301 to form a source region 311 and a drain region 312. At this time, the side wall insulating film 308 serves to reduce ion implantation damage at the edge of the gate electrode.

To prevent the threshold voltage from varying because of a variation in electric field applied during a write/erase, each of the films 302, 306, 303, and 304 constituting the ONO film desirably has a uniform thickness in an area extending from the boundary between the silicon substrate 301 and the source region 311 to the boundary between the silicon substrate 301 and the drain region 312.

The above described configuration constitutes a MONOS type EEPROM memory cell that stores information using charges stored in the charge storage film. The gate length is at most 0.5 μm and at least 0.01 μm. Further, the source region 311 and the drain region 312 are formed by diffusion or ion implantation so that the surface concentration of the impurities (phosphorous, arsenic, or antimony) is $10^{17}$ to $10^{21}$ cm$^{-3}$. Further, the source region 311 and the drain region 312 have a depth of 10 to 500 nm.

Now, a method of manufacturing an ONO film will be described in detail.

First, the silicon oxide film 302 is formed on the silicon substrate 301 so as to have a thickness of 2 to 5 nm. The silicon oxide film 302 is a tunnel oxide film in a MONOS device. Electrons or holes are injected through the silicon oxide film 302.

Next, the silicon nitride film (TCS-SiN film) 306 of 1 to 4 nm thickness is formed on the silicon oxide film 302 using the LPCVD process and using TCS as a silicon source without executing any wet preprocesses or the like. Subsequently, the silicon nitride film (DCS-SiN) 303 of 2 to 20 nm thickness is formed using the LPCVD process and using DCS as a silicon source. The TCS-SiN film 306 and the DCS-SiN film 303 are consecutively formed in this order without exposing the substrate to the air. Nitridation species are preferably ammonia because it enables the silicon nitride films 306 and 303 to be formed in a reducing atmosphere. Typical film formation conditions for the TCS-SiN film 306 include a temperature of 700 to 900° C., a pressure of 0.01 to 10 Torr, and a TCS/nitridation species flow rate ratio of 0.01 to 1. Typical film formation conditions for the DCS-SiN film 303 include a temperature of 600 to 900° C., a pressure of 0.01 to 10 Torr, and a DCS/nitridation species flow rate ratio of 0.01 to 1.

If the film formation temperature is between 700 and 900° C., a silicon nitride film formed using TCS has an Si—H bond density of less than $1\times10^{20}$ cm$^{-3}$ and an N—H bond density of about $7\times10^{21}$ cm$^{-3}$. On the other hand, a silicon nitride film formed using silane or DCS has an Si—H bond density of more than $3\times10^{20}$ cm$^{-3}$ and an N—H bond density of less than $7\times10^{21}$ cm$^{-3}$. This indicates that it is important to reduce the number of Si—H bonds instead of N—H bonds compared to the prior art in order to improve data retention characteristics of a stored state. It also indicates that the number of Si—H bonds in the SiN film can be reduced by lessening the rate of hydrogen in a silicon source gas.

Figure 21:
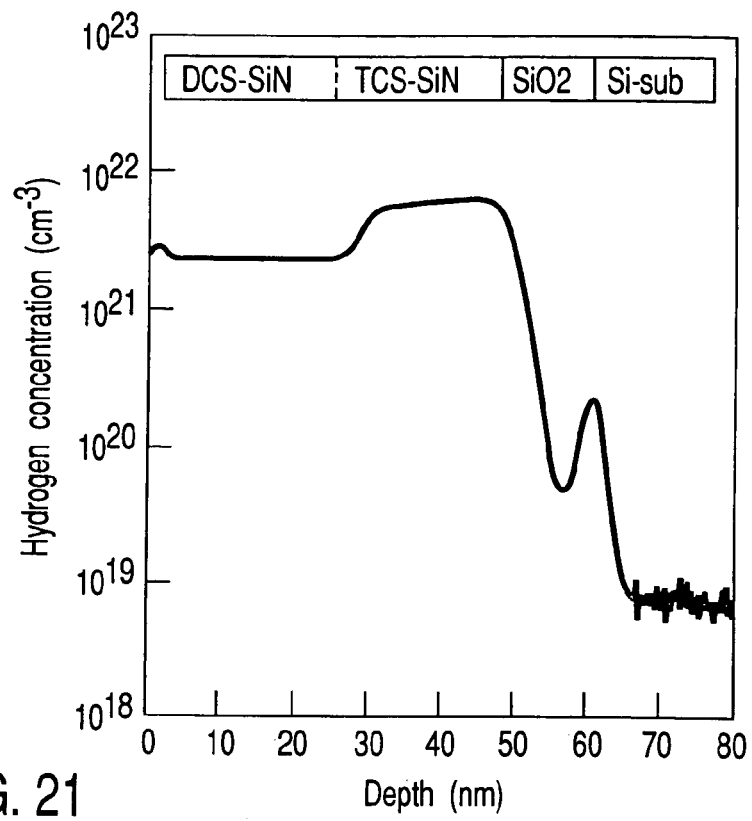
FIG. 21 is a chart showing the relationship between the concentration of hydrogen and depth according to an embodiment of the present invention.

Further, the concentration of hydrogen in TCS-SiN is higher than that of hydrogen in a silicon nitride film formed using silane or DCS. FIG. 21 shows the results of measurements of a sample in which an SiO$_2$ film, a TCS-SiN film, and a DCS-SiN film are sequentially formed on a silicon substrate. The axis of abscissas indicates depth, while the axis of ordinates indicates the concentration of hydrogen. As can be seen in FIG. 21, the concentration of the hydrogen contained in the TCS-SiN film is more than $5\times10^{21}/cm^3$, and the concentration of the hydrogen contained in the DCS-SiN film is less than $5\times10^{21}/cm^3$.

As described above, in this embodiment, the lower TCS-SiN film has a lower Si—H bond density and a higher hydrogen concentration than the upper DCS-SiN film. Accordingly, this embodiment differs entirely from the structure of Jpn. Pat. Appln. KOKAI Publication No. 60-60770, discussed in the prior art section. Further, the inventors have confirmed that in an SiN film formed of dichlorosilane and ammonia, the concentration of hydrogen increases consistently with the number of Si—H bonds (Jpn. Pat. Appln. No. 2001-2975). However, this embodiment is also fundamentally different from this structure. Furthermore, in this embodiment, the TCS-SiN film has an N/Si composition ratio of more than 1.32. On the other hand, an SiN film formed using silane or dichlorosilane has an N—Si composition ratio of less than 1.32. Therefore, it is obvious that the stacked structure of this embodiment cannot be implemented using a silicon nitride film formed using silane or dichlorosilane.

FIG. 23 shows the data retention characteristics after writes/erases (W/E) have been carried out 100,000 times by a tunnel current using a structure of this embodiment. Reference character (b) denotes the case in which the substrate is exposed to $10^6$ Langmuir or more in oxygen containing atmosphere after the formation of a TCS-SiN film and before the formation of a DCS-SiN film. Reference character (a) denotes the case in which the TCS-SiN film and the DCS-SiN film are consecutively formed in this order by exposing the substrate to less than $10^5$ Langmuir in oxygen containing atmosphere after the formation of a TCS-SiN film and before the formation of a DCS-SiN film. An intrinsic flat band voltage is estimated to be −0.5 V±0.2 V. Clearly, the consecutive film formation allows holes and electrons to be more excellently retained after writes/erases. It has hitherto been said that data can be more appropriately retained by increasing the number of oxygen bonds. However, the above described results indicate that data can be more appropriately retained by reducing the number of oxygen bonds. Therefore, desirably, the TCS-SiN and DCS-SiN films are consecutively formed in this order.

Figure 22:
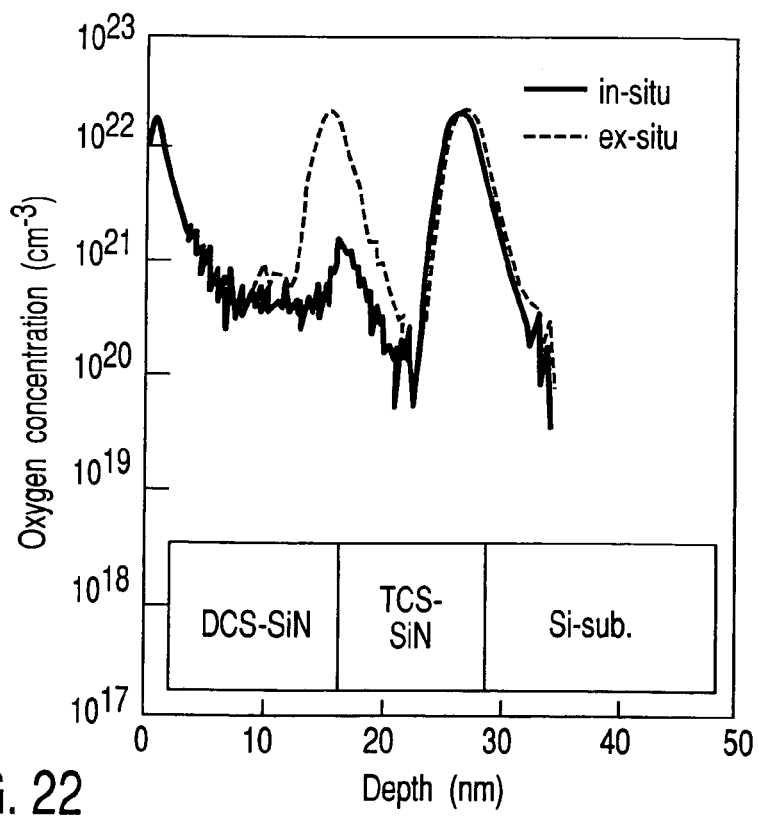
FIG. 22 is a chart showing the relationship between the concentration of oxygen and depth according to an embodiment of the present invention.

Further, if the concentration of hydrogen present near the interface between the TCS-SiN film and the DCS-SiN film increases, then the dielectric constant of the entire SiN film including its interface decreases. This increases the write/erase voltage. The increase in write/erase voltage may cause the data retention characteristic to be markedly degraded after 100,000 writes/erases. FIG. 22 shows the results of measurements of a sample in which a TCS-SiN and DCS-SiN films are sequentially formed on a silicon substrate. The axis of abscissas indicates depth, while the axis of ordinates indicates the concentration of oxygen.

As can be seen in FIG. 22, in the sample in which the TCS-SiN and DCS-SiN films are consecutively formed in this order without exposing the substrate to the air, the concentration of the oxygen present at the interface between the TCS-SiN film and the DCS-SiN film is less than $1\times10^{22}/cm^3$. Consequently, desirably, the concentration of the oxygen present at the interface between the TCS-SiN film and the DCS-SiN film is less than $1\times10^{22}/cm^3$.

Further, the lower TCS-SiN film desirably has characteristics close to stoichiometry and is subject to infrequent charge traps. On the other hand, it is desirable that the upper DCS-SiN film be silicon rich and be subject to frequent traps. An SiN film subject to frequent charge traps is also obtained using material other than DCS, e.g. hexachloro-disilane ($Si_2Cl_6$). The nitridation species have only to be able to control oxidation reduction reaction and may thus be NO, $N_2O$, or the like.

Referring back to FIG. 17, it is assumed that the DCS-SiN film 303 has been formed. Then, the silicon oxide film (a top oxide film) 304 of 2 to 10 nm thickness is formed on the DCS-SiN film 303 without executing any wet preprocesses or the like. The silicon oxide film 304 prevents the injection of charges from the electrode and the leakage of charges from the charge storage layer toward the electrode. Subsequently, to improve the quality of the top oxide film 304, densify annealing is carried out. Alternatively, pyrogenic oxidation may be carried out at 850° C. using oxygen and hydrogen.

Then, the gate electrode 305 and others are formed on the silicon oxide film 304 without executing any wet preprocesses or the like. For example, the gate electrode is formed so as to have a thickness of about 200 nm, using the LPCVD process with silane at a film formation temperature of 600° C. Furthermore, a step of implanting impurity ions, an activation step, and others are executed to obtain the MONOS structure in FIG. 17.

In the MONOS device thus obtained, the center of gravity of charges stored was examined by injecting electrons from the substrate using a tunnel current. FIG. 25 shows the results of examinations of this embodiment. FIG. 26 shows a comparative example with a single layer film composed of a DCS-SiN film. The axis of abscissas indicates the depth of center of gravity of charges from the interface between the charge storage film and the bottom insulating film. The axis of ordinates indicates charge density. Measurements were carried out at temperatures of 213 K (−60° C.), 253 K (−20° C.), and 300 K (27° C.). The TCS-SiN film had a thickness of 2±0.3 nm.

FIG. 26 indicates that in the single-layer DCS-SiN film, the center of gravity of stored charges moves closer to the substrate as the temperature decreases. If the center of gravity moves closer to the substrate as the temperature decreases, a tunnel current of stored charges flowing toward the substrate increases leakage if data are written at a low temperature and then retained at a temperature higher than the write temperature. As a result, the data retention characteristic of the device is significantly degraded. Thus, it is difficult to ensure that a device using a single layer film operates properly at low temperatures. On the other hand, FIG. 25 shows that in the stacked structure of this embodiment, the depth of charges is not dependent on temperature and remains substantially the same until temperature reaches −60° C. Consequently, the use of the stacked structure of this embodiment prevents the characteristics from being degraded at low temperatures. Therefore, this embodiment provides a device that can operate properly at, for example, −20° C.

Further, a comparison of FIG. 25 with FIG. 26 indicates that the center of gravity of stored charges is deeper in this embodiment. At a stored charge density of at most 1 µC/cm², the position of the interface between the TCS-SiN film and the DCS-SiN film corresponds to the position of the center of gravity. Accordingly, even if the interface contains no oxygen, charges can be trapped at a position deeper than that achieved in the prior art. This reduces leakage attributed to a tunnel current of stored charges flowing to the substrate.

The results of detailed examinations indicate that the optimum depth of the interface between the TCS-SiN film and the DCS-SiN film is at least 1 nm and at most 4 nm. This optimum position is deeper than the position of the center of gravity shown in FIG. 26. Further, if the interface lies at a depth of more than 4 nm, most electrons injected by tunnel injection are trapped in the TCS-SiN film. Thus, in this case, the effect of a deeper trap position is not obtained.

It has been shown that the use of the stacked film structure of this embodiment enables the center of gravity of charges injected by tunnel injection to lie deeper. However, similar effects are produced by injecting carriers into the SiN film by hot electron injection. This is because the injected carriers have high energy and are thus very likely to reach the interface.

FIG. 24 shows a flat band voltage when a weak read-disturb stress of 1 to 5 MV/cm is applied. The axis of abscissas indicates the value of a program voltage that provides a write flat band voltage of 2 V. The axis of ordinates indicates a flat band voltage obtained after the read-disturb stress has been applied. The figure indicates that a lower read-disturb flat band voltage allows the read-disturb stress to be more appropriately withstood. This characteristic is obtained after write/erase stress has been applied $10^5$ times.

In the stacked structure of this embodiment, the TCS-SiN film, which undergoes more infrequent electron traps than the DCS-SiN film, is formed near the tunnel interface. Thus, as is apparent from FIG. 24, this embodiment reduces the amount of carriers to be injected when weak field stress is applied, compared to the single-layer TCS-SiN film and the single-layer DCS-SiN film. The resistance of the stacked structure to the read-disturb stress has been discovered by the inventors and has not been reported in the prior art.

The above described results indicate the stacked structure of this embodiment can be effectively used for a structure to which read-disturb stress is necessarily applied during a read, i.e. a device in which a voltage higher than the upper limit of a write threshold voltage is applied to the control electrode during a read. The use of the stacked structure of this embodiment suppresses a variation in threshold voltage caused by read-disturb stress. This prevents data from being destroyed during a read.

An example of such a structure is a NAND type device with current terminals of a plurality of memory cells connected in series (see FIG. 27) as disclosed in Jpn. Pat. Appln. KOKAI Publication No. 11-224908. Another example is a device having a structure in which charges are independently stored in a region located near the source of the charge storage film and in a region located near the drain of the charge storage film as disclosed in U.S. Pat. No. 6,215,148.

FIG. 18 is a sectional view showing a first variation of a MONOS device according to this embodiment. Components in FIG. 18 which correspond to those shown in FIG. 17 are denoted by the same reference numerals.

In this variation, a conductor film 322 is provided between the gate electrode 305 and the metallic conductive film 310. An insulating film 321 is provided on side faces of the side wall insulating film 308. With this structure, a control line connected to the gate electrode 305 can be formed in the same direction as that from the source region 311 to the drain region 312. This structure also allows an AND structure or a virtual ground array structure to be formed. The conductor film 322 is a polysilicon film of 10 to 500 nm thickness which is doped with $1\times10^{19}$ to $1\times10^{21}$ cm$^{-3}$ of impurities (arsenic, phosphorous, or boron). The insulating film 321 is a silicon oxide film or a silicon nitride film. The insulating film 321 is buried between adjacent gate electrodes after the source and drain regions 311 and 312 have been formed.

FIG. 19 is a sectional view showing a second variation of a MONOS device according to this embodiment. Components in FIG. 19 which correspond to those shown in FIG. 17 are denoted by the same reference numerals.

In this variation, a control line composed of the metallic conductive film 310 is formed in the same direction as that from the source region 311 to the drain region 312. Further, in this variation, an isolation insulating film 323 composed of a silicon oxide film is formed on the source and drain regions 311 and 312 in a self-align manner. This variation will be described below in detail.

The bottom insulating film (tunnel insulating film) 302 of 0.5 to 10 nm thickness is formed on the silicon substrate 301. The bottom insulating film 302 is, for example, striped and has the isolation insulating film 323 (thickness: 0.05 to 0.5 µm) formed at the respective sides thereof. The TCS-SiN film 306 of thickness at least 1 nm and at most 4 nm is formed on the bottom insulating film 302 and isolation insulating film 323. The DCS-SiN film 303 of thickness at least 2 nm and at most 20 nm is formed on the TCS-SiN film 306.

This structure is obtained as follows: first, the bottom insulating film 302 is formed on the silicon substrate 301. Subsequently, the TCS-SiN film 306 and the DCS-SiN film 303 are deposited all over the surface and are then patterned. Thereafter, the silicon substrate 301 is oxidized in an oxidizing atmosphere to form the isolation insulating film 323.

The source region 311 and drain region 312, which have a depth of 10 to 500 nm, are provided under the isolation insulating film 323. The source and drain regions 311 and 312 are formed by diffusion or ion implantation. The surface concentration of the impurities used (phosphorous, arsenic, or antimony) is $10^{17}$ to $10^{21}$ cm$^{-3}$. The source and drain regions 311 and 312 can be formed relative to the isolation insulating film 313 in a self-align manner, using the patterned charge storage layers 303 and 306 as masks.

The above described structure has the block insulating film 304 formed thereon and having a thickness of at least 5 nm and at most 30 nm. The block insulating film 304 is a silicon oxide film or a silicon oxinitride film. The gate electrode 305 composed of a polysilicon film is formed on the block insulating film 304 so as to have a thickness of 10 to 500 nm. The polysilicon film contains $1\times10^{19}$ to $1\times10^{21}$ cm$^{-3}$ of impurities (phosphorous, arsenic, or boron). Desirably, the concentration of boron is at most $1\times10^{20}$ cm$^{-3}$ in order to prevent the abnormal diffusion of boron in the silicon oxide film and stabilize a threshold voltage of a p-type MOS transistor. Further, when the concentration of the impurities in the polysilicon film is at least $1\times10^{19}$ cm$^{-3}$, the gate electrode 305 is depleted to reduce an electric field applied to the ONO stacked film. This prevents an increase in erase time.

The block insulating film 304 may be a deposited silicon oxide film such as TEOS or HTO. Alternatively, it may be a silicon oxide film or silicon oxinitride film obtained by oxidizing the SiN film 303.

The metallic conductive film 310 is formed on the gate electrode 305 so as to have a thickness of 10 to 500 nm. The metallic conductive film 310 constitutes gate wiring to which a plurality of gate electrodes are connected. The insulating film 309 composed of a silicon nitride film or a silicon oxide film is formed on the metallic conductive film 310 so as to have a thickness of 5 to 500 nm.

Also in this variation, to prevent the threshold voltage from varying because of a variation in electric field applied during a write/erase, each of the films 302, 306, 303, and 304 constituting the ONO film desirably has a uniform thickness in an area extending from the boundary between the silicon substrate 301 and the source region 311 to the boundary between the silicon substrate 301 and the drain region 312.

In addition to the effects produced by the MONOS device as shown in FIG. 17, this variation provides the following effects:

The control line connected to the gate electrode 305 is formed in the same direction as that from the source region 311 to the drain region 312. Thus, this variation is suitable for implementing a structure in which the source and drain regions of adjacent memory cells are connected together in parallel, for example, an AND type structure or a virtual ground array structure. Further, the source region 311, the drain region 312, and the charge storage film 303 and 306 can be formed relative to the isolation insulating film 323 in a self-align manner. This eliminates the need to ensure alignment margins between these layers, thereby providing a high-density memory cell.

FIG. 20 is a sectional view showing a third variation of a MONOS device according to this embodiment. Components in FIG. 20 which correspond to those shown in FIG. 17 are denoted by the same reference numerals.

This variation is basically similar to the second variation, but differs therefrom in that no isolation insulating films are formed.

The memory cell of this variation can be formed as follows: first, the source region 311 and the drain region 312 are formed in a surface area of the silicon substrate 301 by ion implantation. Subsequently, the bottom insulating film 302, the charge storage films 306 and 303, and the block insulating layer 304 are formed on the silicon substrate 301. Furthermore, a polysilicon film used to form the gate electrode 305 as well as the metallic conductive film 310 is deposited all over the surface. Subsequently, the above described films are patterned. The films may have thicknesses and others similar to those used in the second variation.

In addition to the effects produced by the MONOS device as shown in FIG. 17, this variation provides the following effects.

The control line connected to the gate electrode 305 is formed in the same direction as that from the source region 311 to the drain region 312. Thus, this variation is suitable for implementing a structure in which the source and drain regions of adjacent memory cells are connected together in parallel, for example, an AND type structure or a virtual ground array structure. Further, the thicknesses of the bottom insulating film 302, charge storage films 306 and 303, and block insulating layer 304 do not vary at the ends of the isolation insulating film. Accordingly, a memory cell can be implemented so as to have a uniform thickness. This reduces the distribution of the threshold voltage during a write/erase.

As described above, according to this embodiment, the use of the stacked structure composed of the lower TCS-SiN film and upper DCS-SiN film provides a semiconductor device that excellently retain data.

[Embodiment 6]

In this embodiment, deuterium (D) is introduced into each of the structures described in the fifth embodiment. The introduction of deuterium provides a device that is unlikely to be degraded.

For example, the MONOS device shown in FIG. 17 and described in the fifth embodiment was annealed using a 1 to 10% deuterium gas. The annealing conditions included a normal pressure, a temperature of at least 850° C. and at most 1000° C., and an annealing time of 1 minute to 2 hours. An SIMS-based analysis indicates that the deuterium present at the interface and in the SiN film constituting the charge storage film occupied at least 1% of the whole hydrogen.

The results of evaluation of the electrical characteristics of the MONOS device annealed using deuterium will be described with reference to FIGS. 28 and 29. FIGS. 28 and 29 show the results of evaluation of a capacitor (area: 0.01 mm$^2$) in which measurements were carried out after 100,000 writes/erases. FIG. 28 shows the data retention characteristic, and FIG. 29 shows the read-disturb characteristic. Further, FIGS. 28 and 29 show the results of evaluation of three types of samples (no annealing, nitrogen annealing, and deuterium annealing).

FIG. 28 shows the results of measurements of the decay rate. The data retention characteristic was measured after a write was carried out so that the flat band voltage variation is set to be 3 V. As can be seen in this figure, the decay rate was improved by deuterium annealing.

FIG. 29 shows the read-disturb characteristic. The read-disturb characteristic was evaluated by carrying out an erase so that the flat band voltage is set to be −1 V, applying a voltage of 5 V for 300 seconds, and then measuring the flat band voltage. A NAND structure device has, for example, 16 cells connected in series. When a read is executed on a certain cell, the read voltage is applied to the remaining cells. When a voltage of 5 V is applied for 300 seconds in an erased state, a small amount of write is executed to increase the flat band voltage (read-disturb). As can be seen in FIG. 29, the read-disturb characteristic is substantially improved by deuterium annealing.

The above described two characteristic values serve to determine a memory window after 10 years after read stress has been applied. The deuterium annealing sample have the most excellent characteristics; both data retention characteristic and read-disturb characteristic thereof are improved. The deuterium annealing sample is not significantly degraded after 100,000 writes/erases.

Write/erase stress is expected to form defects in both interface and film. These defects increase the leakage of stored charges toward the substrate to degrade the data retention characteristic. Furthermore, the leakage of charges from the substrate to the nitride film is increased to degrade the read-disturb characteristic. One of the defects which may degrade these characteristics is expected to be Si—H bonds (in this case, for convenience, the term "Si—H bonds" refers to the bonding between silicon and protium). With Si—H bonds, field stress induced by writes/erases causes protium atoms to be released to form dangling bonds of silicon. The dangling bonds of silicon are expected to function as sites in which electrons and holes are trapped. Deuterium annealing substitutes the defects with deuterium to form Si-D bonds. Consequently, the bonds are difficult to cut, so that few defects occur even with repeated writes/erases. This is expected to be the reason why the characteristics are unlikely to be degraded. Further, TCS-SiN has few Si—H bonds. Accordingly, in this case, the bonds may be difficult to cut because N—H bonds are substituted with N-D bonds. In either case, the inventors have found that a charge storage film formed by stacking SiN films together or composed of a TCS-SiN film has improved characteristics when containing deuterium.

A method of introducing deuterium is not limited to the annealing process. For example, the silicon nitride film may be formed using a silicon source or nitridation species containing deuterium. Alternatively, the polysilicon film constituting the electrode may be formed using a silicon source containing deuterium. Furthermore, even with low-temperature annealing, deuterium can be introduced by increasing pressure. Either method serves to produce the effect of introduction of deuterium.

In the above described example, the stacked structure is composed of the TCS-SiN and DCS-SiN films. However, a single layer structure composed of a silicon nitride film containing deuterium may be employed. An example of this structure will be described below.

Methods of forming a silicon nitride film containing deuterium are roughly classified into two types. A first type is a method of using a silicon source containing deuterium (a silicon source with protium substituted with deuterium) and a nitrogen source containing deuterium (a nitrogen source with protium substituted with deuterium). A second type is a method of using a silicon source not containing hydrogen (protium and deuterium) and a nitrogen source containing deuterium. The nitrogen source containing deuterium includes $ND_3$ (ammonia with protium substituted with deuterium) or $N_2D_4$ (hydrazine with protium substituted with deuterium).

The first method is difficult to apply to mass production because the silicon source containing deuterium is very expensive. In contrast, with the second method, TCS or hexachlorodisilane (HCD: $Si_2Cl_6$), which is inexpensive, can be used as a silicon source not containing hydrogen. Consequently, in view of mass production, the second method is preferable.

With the silicon source not containing hydrogen, the amount of deuterium contained in the silicon nitride film depends only on the purity of $ND_3$ or the like. Accordingly, it is easy to allow at least 90% of the whole hydrogen contained in the silicon nitride film to be taken up by deuterium. When an attempt was made to actually form a silicon nitride film using HCD and $ND_3$, a silicon nitride film was obtained which contain at least $1 \times 10^{21}$ $cm^{-3}$ of deuterium and in which at least 99% of the whole hydrogen is deuterium. If the silicon source is composed of TCS or HCD and the nitrogen source is composed of $ND_3$, the concentration of chlorine in the silicon nitride film is more than $1 \times 10^{19}$/$cm^3$.

As described above, according to this embodiment, deuterium is contained in the silicon nitride film to reduce defects therein, thereby providing a semiconductor device that can excellently retain data.

The device structure having a silicon nitride film containing deuterium is also applicable to the first to fifth embodiments, described previously, and a seventh embodiment, described later. That is, in each of the above embodiments, both lower and upper silicon nitride films may be composed of a silicon nitride film containing deuterium. Alternatively, in each embodiment, a single layer structure composed of a silicon nitride film containing deuterium may be used instead of the stacked structure composed of the lower and upper silicon nitride films.

For example, in the first to third embodiments, the above described structure allows a silicon nitride film containing deuterium to function as a barrier to protium. Further, most hydrogen emitted from the silicon nitride film is deuterium. Therefore, the characteristics and reliability of the gate insulating film can be improved.

[Embodiment 7]

Figure 30:
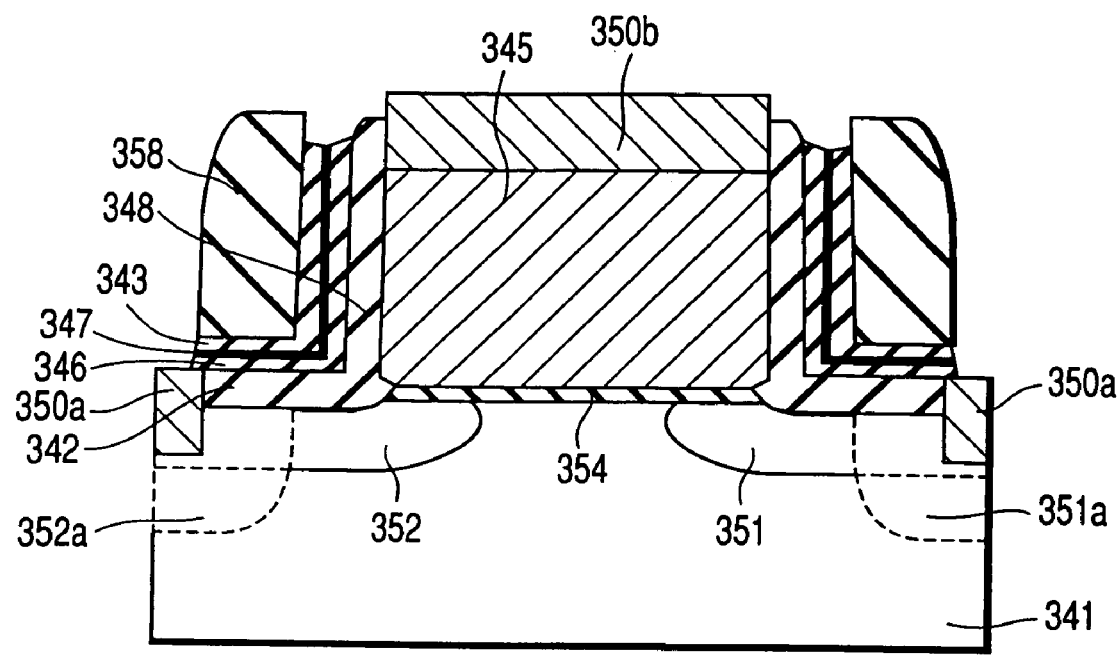
FIG. 30 is a sectional view showing the structure of a semiconductor device according to a seventh embodiment of the present invention.

FIG. 30 is a sectional view showing the structure of a semiconductor device according to a seventh embodiment of the present invention. This embodiment uses a stacked structure composed of silicon nitride films, as a side wall insulating film of a MISFET.

A silicon substrate 341 is provided which has a p-type layer having a boron concentration of $10^{15}$ $cm^{-3}$. Boron or indium ions may be implanted into the p-type layer to optimize the concentration thereof. The energy used to implant ions is, for example, 100 to 1,000 eV. This ion implantation may set the impurity concentration for the p-type layer (p-type well) at $10^{15}$ to $10^{19}$ $cm^{-3}$. Subsequently, a trench type isolation insulating region (not shown) is formed.

Next, a surface of the silicon substrate 341 is oxidized or nitrided to form a gate insulating film 354 so as to have a thickness of about 1 to 100 nm. Then, a polysilicon film 345 constituting a gate electrode is deposited so as to have a thickness of 10 to 200 nm. Furthermore, phosphorous, arsenic, or boron ions are implanted into the polysilicon film 345 to reduce the resistance thereof. To reduce the resistance of a gate electrode, a WSi, CoSi, or W film may be formed on the polysilicon film 345 so as to have a thickness of about 10 to 200 nm. Moreover, lithography and reactive ion etching are used to process the polysilicon film 345 to form a gate electrode.

Then, side walls of the gate electrode 345 are oxidized or oxynitrided to form a side wall silicon insulating film 348 of 1 to 30 nm thickness. At this time, a part of the silicon substrate 341 is oxidized to form a silicon oxide film 342.

Then, to form a shallow source and drain diffusion layers 351 and 352, impurity (phosphorous, arsenic, or antimony) ions are implanted so that the surface concentration thereof is $10^{17}$ to $10^{21}$ $cm^{-3}$. The depth to which ions are implanted is about 10 to 500 nm.

Then, a TCS-SiN film 346 of at least 1 nm and at most 4 nm is formed on the silicon oxide film 342 using an LPCVD process. Subsequently, a DCS-SiN film 343 is formed so as to have a thickness of 2 to 20 nm. The SiN nitride films 343 and 346 prevent the region under the gate electrode 345 from being affected by point defects or impurity diffusion that may occur during the formation of a deep source and drain diffusion layers 351a and 352a. Reference numeral 347 denotes an interface region between the TCS-SiN film 346 and the DCS-SiN film 343. The TCS-SiN film 346 and the DCS-SiN film 343 are consecutively formed in this order without exposing the substrate to the air.

The lower TCS-SiN film 346 desirably has characteristics close to stoichiometry and is subject to infrequent charge traps. It is desirable that the upper DCS-SiN film 343 be silicon rich and be subject to frequent traps. The formation conditions and the like for the lower TCS-SiN film 346 and upper DCS-SiN film 343 are similar to those described above.

Subsequently, TEOS or HTO is used to deposit a silicon oxide film 358 so as to have a thickness of 10 to 200 nm thickness. Furthermore, the silicon oxide film 358 is anisotropically etched so as to leave portions thereof corresponding to the side walls of the gate electrode 345. Moreover, the silicon nitride films 346 and 343 are etched using the silicon oxide film 358 as a mask.

Then, for example, arsenic or phosphorous ions are implanted as n-type impurities to form the deep source and drain diffusion layers 351a and 352a. The ion implantation conditions include an acceleration voltage of 1 to 100 keV and a dosage of $10^{13}$ to $10^{16}$ $cm^{-2}$.

Then, a metallic film of Ni, Co, or Ti is deposited all over the surface so as to have a thickness of 0.01 to 0.3 μm. Subsequently, a thermal process is executed at 600° C. or higher to cause the metallic film and silicon to react with each other. The thermal process forms a metal silicide film 350a on the source and drain diffusion layers 351a and 352a and a metal silicide film 350b on the polysilicon film 345. Furthermore, the metallic film remaining without reacting with the silicon is removed.

The subsequent steps are not shown in the figures. An inter-layer insulating film composed of a silicon oxide film, PSG, or BPSG is deposited so as to have a thickness of 20 to 1,000 nm. Subsequently, lithography and reactive ion etching are used to form a wiring groove and a contact hole. Furthermore, a silicide film (TiSi, WSi, or the like) or a metallic film (Al, W, or the like) is deposited to form wiring.

As described above, in this embodiment, the stacked structure composed of the TCS-SiN film 346 and the DCS-SiN film 343 is used as a side wall insulating film of a MISFET. Description will be given below of the effects of the use of the MISFET shown in FIG. 30 as a logic circuit device.

Figure 31:
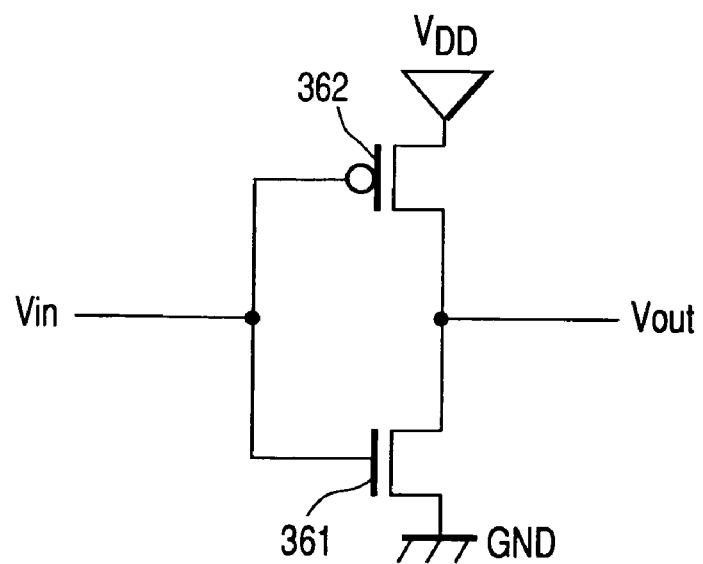
FIG. 31 is an electric circuit diagram showing an example in which the semiconductor device in FIG. 30 is applied to an inverter.

FIG. 31 is a circuit diagram in which an n-type MISFET 361 shown in FIG. 30 and a p-type MISFET 362 are connected together to form a CMOS inverter.

If an input Vin of the inverter varies from VDD to ground GND, a voltage stress of ±VDD is applied to between a drain and a gate of the n-type MISFET 361. For example, if the drain 352 is at the GND and the gate 345 is at the VDD, a MONOS structure is formed in which the insulating film 342 acts as a tunnel insulating film, the SiN films 343 and 346 act as charge storage films, and the side wall insulating film 348 acts as a block insulating film. An electric field is applied so as to inject electrons from the drain 352 into the charge storage film. In contrast, if the drain 352 is at the VDD and the gate 345 is at the GND, a MONOS structure is formed in which the side wall insulating film 348 acts as a tunnel insulating film, the SiN films 343 and 346 act as charge storage films, and the insulating film 342 acts as a block insulating film. An electric field is applied so as to inject electrons from the gate 345 into the charge storage film.

When the inverter in FIG. 31 is operated, electric fields with different signs are applied to the SiN films 343 and 346 in FIG. 30, notably to those parts of the SiN films 343 and 346 which are located very close to the gate insulating film 354. Thus, the SiN films 343 and 346 are degraded. However, in this embodiment, the stacked structure composed of the SiN films 343 and 346 can be used to suppress injection of electrons into the SiN films as already described. This prevents an increase in resistance of the source/drain region caused by the storage of electrons to the SiN films as well as a temporal variation in threshold voltage. Of course, this embodiment produces such effects as described in the above embodiments.

Variations of the above described embodiments are possible. For example, the isolation insulating film or the insulating film can be formed not only by converting the silicon substrate into a silicon oxide or nitride film but also by implanting oxygen ions into a deposited silicon film or oxidizing a deposited silicon film.

Further, the semiconductor substrate may be an n-type silicon substrate in place of the p-type silicon substrate. Alternatively, the semiconductor substrate may be an SOI substrate. Furthermore, the semiconductor substrate may be a single-crystal semiconductor substrate containing silicon such as an SiGe or SiGeC substrate. Further, a p-type device may be formed in place of the n-type device. In this case, indium or boron may be used as p-type impurities.

Further, the semiconductor used for the gate electrode may be Si, SiGe, or SiGeC. Furthermore, the gate electrode may be composed of metal such as W, Ta, Ti, Hf, Co, Pt, Pd, or Ni, or a silicide thereof. Alternatively, it may be formed of a stacked film composed of any of the above materials. The Si, SiGe, and SiGeC may be polycrystal or amorphous or may be a stacked structure thereof. The use of a semiconductor containing Si enables a p-type gate electrode to be formed. This prevents the injection of electrons from the gate electrode. Furthermore, the charge storage layer may be arranged like dots.

[Embodiment 8]

FIG. 32 is a sectional view showing the structure of a semiconductor device (a non-volatile memory) according to an eighth embodiment of the present invention.

On a silicon substrate 401, the following components are sequentially formed: a tunnel insulating film 402, a floating gate electrode 403 constituting a charge storage film, an inter-electrode insulating film 404, and a control gate electrode 405. Further, a side wall oxide film 406 is formed on the silicon substrate 401 and around a gate structure. Furthermore, a source region 407 and a drain region 408 are formed to sandwich the gate structure. In the example shown in FIG. 32, the tunnel insulating film 402 is present only immediately below the floating gate electrode 403 but may extend to the outside thereof.

The tunnel insulating film 402 is formed of a silicon nitride film containing hydrogen bonded to nitrogen. The hydrogen is mainly deuterium (D). Further, the tunnel insulating film 12 has a physical thickness of 9 nm (5.5 nm in terms of silicon oxide film thickness).

A memory device in which 90% of the hydrogen bonded to nitrogen was deuterium was compared with the prior art (a memory device in which substantially all hydrogen bonded to nitrogen was protium) for device reliability obtained after 100,000 writes/erases. During an operation, a voltage of 7.9 V was applied to the tunnel insulating film. This embodiment served to reduce a low field leakage current called SILC (Stress Induced Leakage Current) and which is generated in the tunnel insulating film during a write/erase, by two orders of magnitude compared to the prior art. Further, this embodiment served to reduce the malfunction occurrence rate of the memory device down to at most one-tenths, while increasing the data retention time by two orders of magnitude.

These effects are expected to be produced because a proper vibration frequency called a "binding mode" possessed by nitrogen-deuterium bonds (N-D bonds) is close to a proper vibration frequency called a "stretching mode" possessed by silicon-nitrogen bonds (Si—N bonds). That is, when electrons with high energy pass through the tunnel insulating film during a write/erase operation, energy provided to the N-D bonds is quickly distributed to the surrounding Si—N bonds owing to a resonance phenomenon. Thus, the N-D bonds are not cut. Consequently, no structural defects on an atomic level occur in the tunnel insulating film, thereby suppressing a leakage current.

The bending mode proper vibration frequency of the N-D bonds is estimated to be $1190 \times \sqrt{2} = 840$ cm$^{-1}$ on the basis of the bending mode proper vibration frequency (1190 cm$^{-1}$) of the N—H bonds (in this case, nitrogen-protium bonds for convenience). On the other hand, when the stretching mode proper vibration frequency of the Si—N bonds was actually measured, it was 830±100 cm$^{-1}$ for a silicon nitride film deposited using the LPCVD process, 850±90 cm$^{-1}$ for a silicon nitride film formed by thermally nitriding a silicon substrate in an ammonia gas atmosphere, and 880±40 cm$^{-1}$ for a silicon nitride film formed by thermally nitriding a silicon oxide film in an ammonia gas atmosphere. These results support the above described resonance phenomenon model.

When the numbers of N—H bonds and N-D bonds in the tunnel nitride film are defined as [N—H] and [N-D], respectively, the above described effects are marked if [N-D]/([N—H]+[N-D]) is larger than 0.5. To obtain sufficient effects, this ratio is desirably larger than 0.9. Further, the tunnel nitride film may contain oxygen. When the concentrations of nitrogen and oxygen in the tunnel nitride film are defined as [N] and [O], respectively, the above effects are marked if [N]/([N]+[O]) is larger than 0.5. To obtain sufficient effects, this ratio is desirably larger than 0.9.

The silicon nitride film in this embodiment can be formed through an LPCVD process using as a source gas TCS and ammonia ($ND_3$) containing deuterium (D) substituted for protium. This process provides a silicon nitride film with [N-D]/([N—H]+[N-D])>0.9 and [N]/([N]+[O])>0.9.

Alternatively, DCS may be used in place of TCS. In this case, a silicon nitride film with [N-D]/([N—H]+[N-D])=0.8 to 0.9 and [N]/([N]+[O])=0.9 is obtained. Alternatively, a plasma CVD process may be used which uses as source gases silane ($SiD_4$) containing deuterium (D) substituted for protium and nitrogen ($N_2$). In this case, a silicon nitride film with [N-D]/([N—H]+[N-D])>0.9 and [N]/([N]+[O])=0.8 to 0.9 is obtained. Furthermore, these silicon nitride film may be oxidized. In this case, the concentration of oxygen in the film increase. However, the total amount of hydrogen in the film can be reduced, thereby making the device more reliable.

The values [N—H] and [N-D] of the silicon nitride film can be obtained using a transmission-type Fourier transform type infrared absorption method (FT-IR method). For example, the value [N—H] can be calculated from a vibration peak of the stretching mode located near a vibration frequency of 3340 $cm^{-1}$. The value [N-D] can be calculated from a vibration peak of the stretching mode located near a vibration frequency of 2370 $cm^{-1}$.

As described above, this embodiment substantially reduced a leakage current of the tunnel insulating film which may be generated during a write/erase. Therefore, this embodiment provides a non-volatile memory device that can more appropriately retain data.

[Embodiment 9]

FIG. 33 is a sectional view showing the structure of a semiconductor device (non-volatile memory) according to a ninth embodiment of the present invention. On a silicon substrate 421, the following components are sequentially formed: a tunnel insulating film (bottom insulating film) 422, a silicon nitride film 423 constituting a charge storage film, a top insulating film 424, and a gate electrode 425. Further, a side wall oxide film 426 is formed on the silicon substrate 421 and around a gate structure. Furthermore, a source region 427 and a drain region 428 are formed to sandwich the gate structure. That is, this embodiment relates to a non-volatile memory having a MONOS structure. In the example shown in FIG. 33, the tunnel insulating film 422 is present only immediately below the control gate electrode 425 but may extend to the outside thereof.

The tunnel insulating film 422 is formed of a silicon nitride film containing hydrogen bonded to nitrogen. The hydrogen is mainly deuterium (D). The basic configuration of and manufacture method for the tunnel insulating film 422 (silicon nitride film) and others are similar to those described in the eighth embodiment.

Also in this embodiment, the silicon nitride film contains deuterium, thereby providing a non-volatile memory device that can more appropriately retain data, as in the eighth embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate;
    a gate electrode;
    a first insulating film formed between the semiconductor substrate and the gate electrode; and
    a second insulating film formed near the gate electrode and including a lower silicon nitride film containing nitrogen, silicon and hydrogen and an upper silicon nitride film formed on the lower silicon nitride film and containing nitrogen, silicon, and hydrogen,
    wherein a concentration of hydrogen contained in the lower silicon nitride film is higher than a concentration of hydrogen contained in the upper silicon nitride film, and
    wherein a density of the lower silicon nitride film is lower than 2.68 $g/cm^3$, and a density of the upper silicon nitride film is higher than 2.68 $g/cm^3$.

2. The semiconductor device according to claim 1, wherein a density of Si—H bonds in the lower silicon nitride film is lower than $1 \times 10^{20}/cm^3$, and a density of Si—H bonds in the upper silicon nitride film is higher than $1 \times 10^{20}/cm^3$.

3. The semiconductor device according to claim 1, wherein the hydrogen includes an isotope of hydrogen.

4. The semiconductor device according to claim 1, wherein the concentration of hydrogen contained in the lower silicon nitride film is higher than $5 \times 10^{21}/cm^3$, and the concentration of hydrogen contained in the upper silicon nitride film is lower than $5 \times 10^{21}/cm^3$.

5. The semiconductor device according to claim 1, wherein a concentration of oxygen at an interface between the lower silicon nitride film and the upper silicon nitride film is lower than $1 \times 10^{22}/cm^3$.

6. The semiconductor device according to claim 1, wherein the gate electrode includes a silicon film or a silicon germanium film containing boron having a concentration of higher than $1 \times 10^{19}/cm^3$ and lower than $1 \times 10^{21}/cm^3$.

7. The semiconductor device according to claim 1, wherein the semiconductor substrate includes a source region, a drain region and a channel region sandwiched between the source region and the drain region.

8. The semiconductor device according to claim 7, further comprising another gate electrode and an inter-electrode insulating film formed between the gate electrode and the another gate electrode.

9. The semiconductor device according to claim 7, wherein a thickness of the lower silicon nitride film is at least 1 nm and at most 4 nm.

10. The semiconductor device according to claim 7, wherein a thickness of the lower silicon nitride film is equal to or smaller than that of the upper silicon nitride film.

11. A semiconductor device comprising:
    a semiconductor substrate, wherein the semiconductor substrate includes a source region, a drain region and a channel region sandwiched between the source region and the drain region;
    a gate electrode;

a first insulating film formed between the semiconductor substrate and the gate electrode; and a second insulating film formed near the gate electrode and including a lower silicon nitride film containing nitrogen, silicon and hydrogen and an upper silicon nitride film formed on the lower silicon nitride film and containing nitrogen, silicon, and hydrogen, wherein a concentration of hydrogen contained in the lower silicon nitride film is higher than a concentration of hydrogen contained in the upper silicon nitride film;

a third insulating film formed on a side surface of the gate electrode; and a fourth insulating film formed on the drain region, wherein the second insulating film is formed on the third and fourth insulating films.

12. The semiconductor device according to claim 11, wherein a density of Si—H bonds in the lower silicon nitride film is lower than $1 \times 10^{20}/cm^3$, and a density of Si—H bonds in the upper silicon nitride film is higher than $1 \times 10^{20}/cm^3$.

13. The semiconductor device according to claim 11, wherein the hydrogen includes an isotope of hydrogen.

14. The semiconductor device according to claim 11, wherein the concentration of hydrogen contained in the lower silicon nitride film is higher than $5 \times 10^{21}/cm^3$, and the concentration of hydrogen contained in the upper silicon nitride film is lower than $5 \times 10^{21}/cm^3$.

15. The semiconductor device according to claim 11, wherein a density of the lower silicon nitride film is lower than 2.68 $g/cm^3$, and a density of the upper silicon nitride film is higher than 2.68 $g/cm^3$.

16. The semiconductor device according to claim 11, wherein a concentration of oxygen at an interface between the lower silicon nitride film and the upper silicon nitride film is lower than $1 \times 10^{22}/cm^3$.

17. The semiconductor device according to claim 11, wherein the gate electrode includes a silicon film or a silicon germanium film containing boron having a concentration of higher than $1 \times 10^{19}/cm^3$ and lower than $1 \times 10^{21}/cm^3$.

18. The semiconductor device according to claim 11, further comprising another gate electrode and an interelectrode insulating film formed between the gate electrode and the another gate electrode.

19. The semiconductor device according to claim 11, wherein a thickness of the lower silicon nitride film is at least 1 nm and at most 4 nm.

20. The semiconductor device according to claim 11, wherein a thickness of the lower silicon nitride film is equal to or smaller than that of the upper silicon nitride film.

* * * * *